(12) United States Patent
Duan et al.

(10) Patent No.: US 12,122,666 B2
(45) Date of Patent: Oct. 22, 2024

(54) MICROELECTRONICS H-FRAME DEVICE

(71) Applicant: Northrop Grumman Systems Corporation, Falls Church, VA (US)

(72) Inventors: Dah-Weih Duan, Torrance, CA (US); Elizabeth T. Kunkee, Manhattan Beach, CA (US); Martin E. Roden, Long Beach, CA (US); Laura M. Woo, Rossmoor, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 547 days.

(21) Appl. No.: 17/198,700

(22) Filed: Mar. 11, 2021

(65) Prior Publication Data
US 2022/0289559 A1 Sep. 15, 2022

(51) Int. Cl.
*B81B 7/00* (2006.01)
*B81C 3/00* (2006.01)

(52) U.S. Cl.
CPC .......... *B81B 7/0006* (2013.01); *B81B 7/0019* (2013.01); *B81C 3/001* (2013.01);
(Continued)

(58) Field of Classification Search
CPC .............. B81B 7/0006; B81B 2207/07; B81B 2207/091; H01L 2223/6644;
(Continued)

(56) References Cited

U.S. PATENT DOCUMENTS 5,319,329 A  6/1994 Shiau et al.
6,128,195 A * 10/2000 Weber .................... H05K 3/284
                                                    361/752
(Continued)

FOREIGN PATENT DOCUMENTS

CN  101420056  4/2009
CN  102354783  2/2012
(Continued)

OTHER PUBLICATIONS

Elizabeth T. Kunkee, D. Duan, A. Sulian, P. Ngo, N. Lin, C. Zhang, D. Ferizovic, C. M. Jackson, and R. Lai, "Suspended SiC Filter with DRIE Silicon Subcover," IEEE International Microwave Symposium, Paper We32-293, Jun. 21, 2020. IEEE-MTT Industry Paper Finalist; pp. 1051-1054.

(Continued)

*Primary Examiner* — Shahed Ahmed
*Assistant Examiner* — Sun Mi Kim King
(74) *Attorney, Agent, or Firm* — KLINTWORTH & ROZENBLAT IP LLP

(57) ABSTRACT

A microelectronics H-frame device includes: a stack of two or more substrates wherein the substrate stack comprises a top substrate and a bottom substrate, wherein bonding of the top substrate to the bottom substrate creates a vertical electrical connection between the top substrate and the bottom substrate, wherein the top surface of the top substrate comprises top substrate top metallization, wherein the bottom surface of the bottom substrate comprises bottom substrate bottom metallization; mid-substrate metallization located between the top substrate and the bottom substrate; a micro-machined top cover bonded to a top side of the substrate stack; and a micro-machined bottom cover bonded to a bottom side of the substrate stack.

11 Claims, 18 Drawing Sheets

(52) U.S. Cl.
 CPC .......... *B81C 3/005* (2013.01); *B81B 2207/07* (2013.01); *B81B 2207/091* (2013.01)
(58) Field of Classification Search
 CPC ... H01L 2223/6683; H01L 2224/29011; H01L 2224/32145; H01L 23/04; H01L 23/06
 See application file for complete search history.

(56) References Cited

U.S. PATENT DOCUMENTS

| | | |
|---|---|---|
| 6,522,214 B1 | 2/2003 | Harju et al. |
| 6,734,750 B1 | 5/2004 | Ostergaard |
| 9,627,736 B1 | 4/2017 | Ingalls |
| 9,761,547 B1 | 9/2017 | Kunkee et al. |
| 9,865,909 B2 | 1/2018 | Chan |
| 10,153,222 B2 | 12/2018 | Yu et al. |
| 11,470,695 B2 | 10/2022 | Kunkee et al. |
| 2003/0206261 A1 | 6/2003 | Cahill |
| 2007/0048898 A1 | 3/2007 | Carlson et al. |
| 2008/0001241 A1 | 1/2008 | Tuckerman et al. |
| 2008/0002460 A1 | 1/2008 | Tuckerman et al. |
| 2010/0148293 A1* | 6/2010 | Jain ............ A61B 5/0017 257/E21.135 |
| 2012/0094442 A1 | 4/2012 | Lin et al. |
| 2016/0030965 A1* | 2/2016 | Lin .............. H10N 30/877 239/102.2 |
| 2018/0352651 A1 | 12/2018 | Tazzoli et al. |
| 2019/0081380 A1 | 3/2019 | Bates |
| 2020/0091608 A1 | 3/2020 | Alpman et al. |
| 2020/0075503 A1 | 5/2020 | Chuang et al. |

FOREIGN PATENT DOCUMENTS

| | | |
|---|---|---|
| CN | 108074872 | 4/2018 |
| CN | 108598638 | 9/2018 |
| WO | WO 2007-103224 | 9/2007 |
| WO | WO 2016133457 | 8/2016 |

OTHER PUBLICATIONS

International Search Report in related Application Serial No. PCT/US2021/015211, issued on Apr. 20, 2021, 28 pages.
International Preliminary Report on Patentability in related Application Serial No. PCT/US2021/031224, issued on Jan. 26, 2023, 10 pages.
Invitation To Pay Additional Fees in related Application Serial No. PCT/US2022/015204. issued on May 23, 2022, 16 pages.
International Search Report in related Application Serial No. PCT/US2022/016263, issued on Jul. 22, 2022, 20 pages.
International Search Report in related Application Serial No. PCT/US2022/015205, issued on Jul. 14, 2022, 22 pages.
Song Lin, Development of an Ultra-Wideband Suspended Stripline to Shielded Microstrip Transition, IEEE Microwave and Wireless Components Letters, vol. 21, No. 9, Sep. 2011, pp. 474-476.
Young-Gon Kim and Kang Wook Kim, A New Design Method for Ultra-Wideband Microstrip-To-Suspended Stripline Transitions, Machine Copy for Proofreading, vol. x, y-z, 2013, pp. 1-14.
Dr. Burhan Bayraktaroglu, Heterogeneous Integration Technology, Final Report, Aug. 2017, 108 pages.
Yuan Li, Pete L. Kirby, and John Papapolymerou, Silicon Micromachined W-Band Bandpass Filter Using DRIE Technique, Proceedings of the 36th European Microwave Conference, Sep. 2006, Manchester UK, pp. 1271-1273.
John C. Tippet and Ming J. Shiau, Circuit Transformations for Realization of a Class of Miniature Printed Circuit Filters, IEEE MTT-S Digest, 1994, pp. 621-624.
Mingqi Chen, A 1-25 GHZ GaN Hemt MMIC Low-Noise Amplifier, IEEE Microwave and Wireless Components Letters, vol. 20, No. 10, Oct. 2010, pp. 563-565.
Yemin Tang, et al., Ultra Deep Reactive Ion Etching of High Aspect Ratio and Thick Silicon Using a Ramped-Parameter Process, Journal of Microelectromechanical Systems, vol. 27, No. 4, Aug. 2018, pp. 686-697.
Vesna Radisic, et al., Heterogeneously Integrated V-Band Amplifier, IEEE/MTT-S International Microwave Symposium, 2018, pp. 289-292.
Wolfgang Menzel, Quasi-Lumped Suspended Stripline Filters and Diplexers, IEEE Transactions On Microwave Theory and Techniques, vol. 53, No. 10, Oct. 2005, pp. 3230-3237.
Kenjiro Nishikawa, et al., Compact 60-GHz LTCC Stripline Parallel-coupled Bandpass Filter with Parasitic Elements for Millimeter-wave System-on-Package, NTT Network Innovation Laboratories, NTT Corporation, Japan, IEEE, 2007, pp. 1649-1652.
Jian-Xing Zhuang, Silicon Micromachined Terahertz Bandpass Filter With Elliptic Cavities, IEEE Transactions On Terahertz Science and Technology, vol. 5, No. 6, Nov. 2015, pp. 1040-1047.
Jiunnjye Tsaur, et al, A Ground Shielded Low Loss Transmissi163-166ON Line Using Au-To-Au Thermo Compressive Packaging for Rf Applications, IEEE, 2005, pp. 163-166.
Soon Young Eom et al., Compact Broadband Microstrip Crossover With Isolation Improvement and Phase Compensation, IEEE Microwave and Wireless Components Letters, vol. 24, No. 7, Jul. 2014, pp. 481-483.
Jeong-Geun Kim et al., Miniature Four-Way and Two-Way 24 GHz Wilkinson Power Dividers in 0.13 μm CMOS, IEEE Microwave and Wireless Components Letters, vol. 17, No. 9, Sep. 2007, pp. 658-660.
Adel A. M. Saleh, Planar Electrically Symmetric n-Way Hybrid Power Dividers/Combiners, IEEE Transactions On Microwave Theory and Techniques, vol. MTT-28, No. 6, Jun. 1980, pp. 555-563.
Soumendu Sinha, et al., Design and Optimization of Rf Mems T-Type Switch for Redundancy Switch Matrix Applications, 2012 International Conference On Computing, Electronics and Electrical Technologies [ICCEET], 2012, pp. 501-508.
Yana Taryana et al., Four Way Power Divider Using Wilkinson Method for X-Band Radar, 2019 International Conference On Radar, Antenna, Microwave, Electronics, and Telecommunications, 2019, pp. 41-45.
Ernest J. Wilkinson, An N-Way Hybrid Power Divider, IRE Transactions On Microwave Theory and Techniques, Jan. 1960, pp. 116-118.
Liu Xin et al., A Novel Compact Planar Crossover With Simple Design Procedure, Proceedings of Asia-Pacific Microwave Conference 2010, pp. 1633-1636.
International Search Report in related Application Serial No. PCT/US2021/031224, issued on Jul. 19, 2021, 27 pages.
Hsieh et al., Design of Ku-Band SIR Interdigital Bandpass Filter Using Silicon-Based Micromachining Technology, Silicon Monolithic Integrated Circuits in RF Systems (SIRF), 2010 Topical Meeting On, IEEE, Jan. 11, 2010, pp. 104-107.
Mokhtaari et al., Ultra-wideband and notched wideband filters with grounded vias in microstrip technology, Microwave Conference, 2008. AMPC 20008. Asia-Pacific, IEEE, Dec. 16, 2008, p.
Stephen V. Robertson et al., Micromachined Self-Packaged W-Bandpass Filters, IEEE MTT-S International Microwave Symposium Digest. Orlando, May 16-20, 1995; IEEE MTT-S International Microwave Symposium Digest, May 16, 1995, vol. 3, pp. 1543-1546.

\* cited by examiner

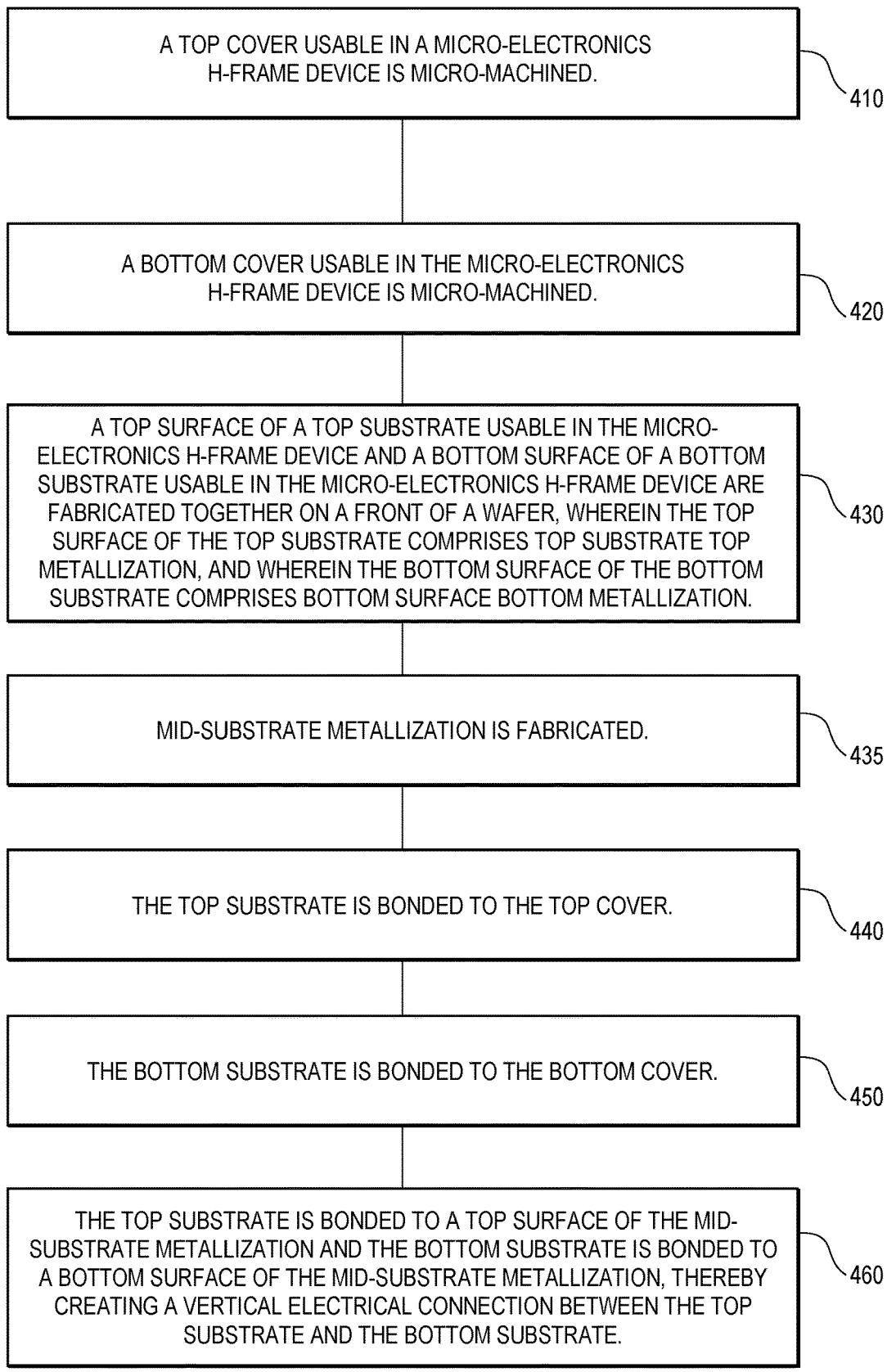

MICROELECTRONICS H-FRAME DEVICE

STATEMENT OF GOVERNMENT RIGHTS

The Government of the United States of America has rights in this invention pursuant to Government Contract No. 17-C-3186.

CROSS-REFERENCE TO RELATED APPLICATIONS

This application contains subject matter that is related to the subject matter of the following applications, which are assigned to the same assignee as this application. The below-listed applications are hereby incorporated herein by reference in its entirety:

"FILTER WITH AN ENCLOSURE HAVING A MICRO-MACHINED INTERIOR USING SEMICONDUCTOR FABRICATION," by Kunkee, et al., filed on Apr. 28, 2020, U.S. Ser. No. 16/860,642.

"CHANNELIZED FILTER USING SEMICONDUCTOR FABRICATION," by Duan, et al., filed on Jun. 30, 2020, U.S. Ser. No. 16/916,644.

SUMMARY

A microelectronics H-frame device comprises a stack of two or more substrates with a micro-machined top cover bonded to a top side of the device and a micro-machined bottom cover bonded to a bottom side of the device, forming an "H-frame" package entirely fabricated with microelectronics technologies. "H-frame" refers to a double-sided metal housing where electronics are packaged to form a "module." Specifically the letter "H" refers to the shape of a vertical cross section of the housing. The horizontal bar in "H" refers to the "center web" or the common, shared floor for component attachment. Substrate transmission lines, printed circuit boards and other electronic components are bonded to both the top side and bottom side of the center web. The vertical bars in "H" refers to the surrounding vertical walls of the housing.

A microelectronics H-frame device comprises a stack of four or more semiconductor layers. One or more of a top semiconductor and a bottom semiconductor create housing of the device. The middle semiconductors comprise substrates that provide surfaces for electrical signal transmission. The one or more of the top semiconductor and the bottom semiconductors are micro-machined to form one or more of cavities and walls to isolate the radio frequency (RF) signal. The one or more of the top semiconductor and the bottom semiconductor are then metalized. Metal bumps are added to the bottom of the walls of the one or more of the top semiconductor and the bottom semiconductor. The middle substrates are processed on wafers. Plated onto the middle substrates are one or more of transmission lines, filters, other circuits, ground planes, and bonding bumps. Electrical connections between all surfaces of the middle substrates are provided using one or more of through-wafer vias and crushed metal bonding bumps between substrates. Electrical connections are thereby created between the two sides of the H-frame housing. All four semiconductor layers are then aligned and bonded together. The metalized layer between the two middle substrates enables the signals to escape the microelectronics H-Frame housing without a need to add one or more of mechanical holes and connectors into the housing.

The levels are bonded using compression bonding. Alternatively, or additionally, wafer-scaled eutectic alloy bonding is used to bond together the upper and lower silicon micro-machined cavities with the stack of two or more substrates. For example, the upper and lower cavities are bonded with the center conductor using one or more of a wafer-scale gold-indium bond and a wafer-scale gold-gold bond. For example, the levels are bonded using gold-to-gold thermocompression bonding.

The H-frame device has two chips bonded together to make a vertical electrical connection. In the H-frame, the layers of gold can be used to form electrically conductive artwork, shield an electrical signal that propagates along the artwork, or it can have features and openings to allow for vertical interconnects.

The artwork of the top and bottom chips may be different. The upper and lower chips, even if different, may be fabricated on the same wafer. A top surface of the top chip and a bottom surface of the bottom chip are fabricated together on the front of a wafer. When the wafer is diced into chips, an upper chip and a lower chip can be bonded together, bottom surfacte-to-bottom surface. Using a first dedicated wafer for the upper chip and using a second dedicated wafer for the lower chip is also possible when a number of desired chips is large, for example, when the number of desired chips is larger than approximately twenty.

As one example, embodiments of the invention provide a compact vertical feed-through transition allowing a spiral inductor to "escape" a sealed cavity.

The device comprises mid-substrate metallization located between the top substrate and the bottom substrate. Metallization in the top cover and the bottom cover, and through-substrate vias comprised in the substrates together form a continuous metal shielding, or "walls" for the package. The through-substrate vias are preferably metallized. Mid-substrate metallization (a "middle" metal layer) comprising one or more of bottom substrate top metallization and top substrate bottom metallization is sandwiched between the two substrates in the new H-frame. Bumps join these two metallizations together through the bonding process. The terms "bump" or "bumps" as used in this document refer to metallic mounds intended to create one or more of an electrical connection and a physical connection. For example, the one or more of an electrical connection and a physical connection is created using one or more of gold-indium thermocompression bonding and gold-gold thermocompression bonding.

Passive circuits such as filters, power splitters, couplers, etc. can be directly patterned on the top side of a substrate. Similarly, pads can be directly patterned on the top side of the substrate. The pads are usable for attaching discrete circuits such as monolithic microwave integrated circuits (MMICs), capacitors, and the like. A radio frequency (RF) transmission line may comprise one or more of a microstrip, a coplanar waveguide (CPW), and a stripline. The RF transmission line can travel on a top side of either substrate or even in the thin "center web" layer, i.e. a "middle" metal layer. The RF transmission line can switch layers by means of metallized through-substrate vias. The RF transmission line can transition to a different line type while maintaining minimal electrical reflection loss with fully integrated transitions comprising one or more of through-substrate vias, patterned metallization on the substrates, isolation walls composed of the metallized through-substrate vias, and vertical walls comprised in the covers.

The alcove created in one of the covers, positioned at the electrical input and output of the H-frame, has metallized walls, helps gradually transforming the direction of the electric field from being vertical (in the microstrip line) to horizontal (in the so called "vertical coaxial cable" formed by the signal via and its surrounding ground vias). This helps achieving good return loss as well as containing the radiation leakage, resulting in a transition design with sound RF integrity.

An alcove is part of an outer wall of a cover that is used to create an escape transition. The alcove is contoured to facilitate a good RF transition. The alcove does not break the wall or introduce a hole in the outer wall, and hence maintains the environmental seal provided by the outer wall of a cover.

A microelectronics H-frame device includes: a stack of two or more substrates wherein the substrate stack comprises a top substrate and a bottom substrate, wherein bonding of the top substrate to the bottom substrate creates a vertical electrical connection between the top substrate and the bottom substrate, wherein the top surface of the top substrate comprises top substrate top metallization, wherein the bottom surface of the bottom substrate comprises bottom substrate bottom metallization; mid-substrate metallization located between the top substrate and the bottom substrate; a micro-machined top cover bonded to a top side of the substrate stack; and a micro-machined bottom cover bonded to a bottom side of the substrate stack. A method for fabricating a micro-electronics H-frame device includes: micro-machining a top cover usable in the device; micro-machining a bottom cover usable in the device; fabricating together on a front of a wafer a top surface of a top substrate, the top substrate usable in the device, and a bottom surface of a bottom substrate, the bottom substrate usable in the device, wherein the top surface of the top substrate comprises top substrate top metallization, and wherein the bottom surface of the bottom substrate comprises bottom surface bottom metallization; fabricating mid-substrate metallization; bonding the top substrate to the top cover; bonding the bottom substrate to the bottom cover; and bonding the top substrate to a top surface of the mid-substrate metallization and bonding the bottom substrate to a botto surface of the mid-substrate metallization, thereby creating a vertical electrical connection between the top substrate and the bottom substrate.

A microelectronics H-frame device includes: a stack of two or more substrates, wherein the substrate stack comprises a top substrate and a bottom substrate, wherein a top surface of the top substrate and a bottom substrate of the bottom surface are fabricated together on a front of a wafer, wherein at least one of the top substrate and the bottom substrate comprises at least one of a transmission line, a filter, a power splitter, a coupler, and another electronic component, wherein bonding of the top substrate to the bottom substrate creates a vertical electrical connection between the top substrate and the bottom substrate, wherein the top surface of the top substrate comprises top substrate top metallization, wherein the bottom surface of the bottom substrate comprises bottom substrate bottom metallization; mid-substrate metallization located between the top substrate and the bottom substrate; a micro-machined top cover bonded to a top side of the substrate stack, the top cover comprising top cover metallization; and a micro-machined bottom cover bonded to a bottom side of the substrate stack, the bottom cover comprising bottom cover metallization.

DESCRIPTION OF THE DRAWINGS

The accompanying drawings provide visual representations which will be used to more fully describe various representative embodiments and can be used by those skilled in the art to better understand the representative embodiments disclosed herein and their inherent advantages. In these drawings, like reference numerals identify corresponding elements.

FIG. 4 is a flow chart of a method 400 for fabricating a micro-electronics H-frame device.

DETAILED DESCRIPTION

FIGS. 1A-1H are a set of eight drawings of a microelectronics H-Frame device.

Figure 1A:
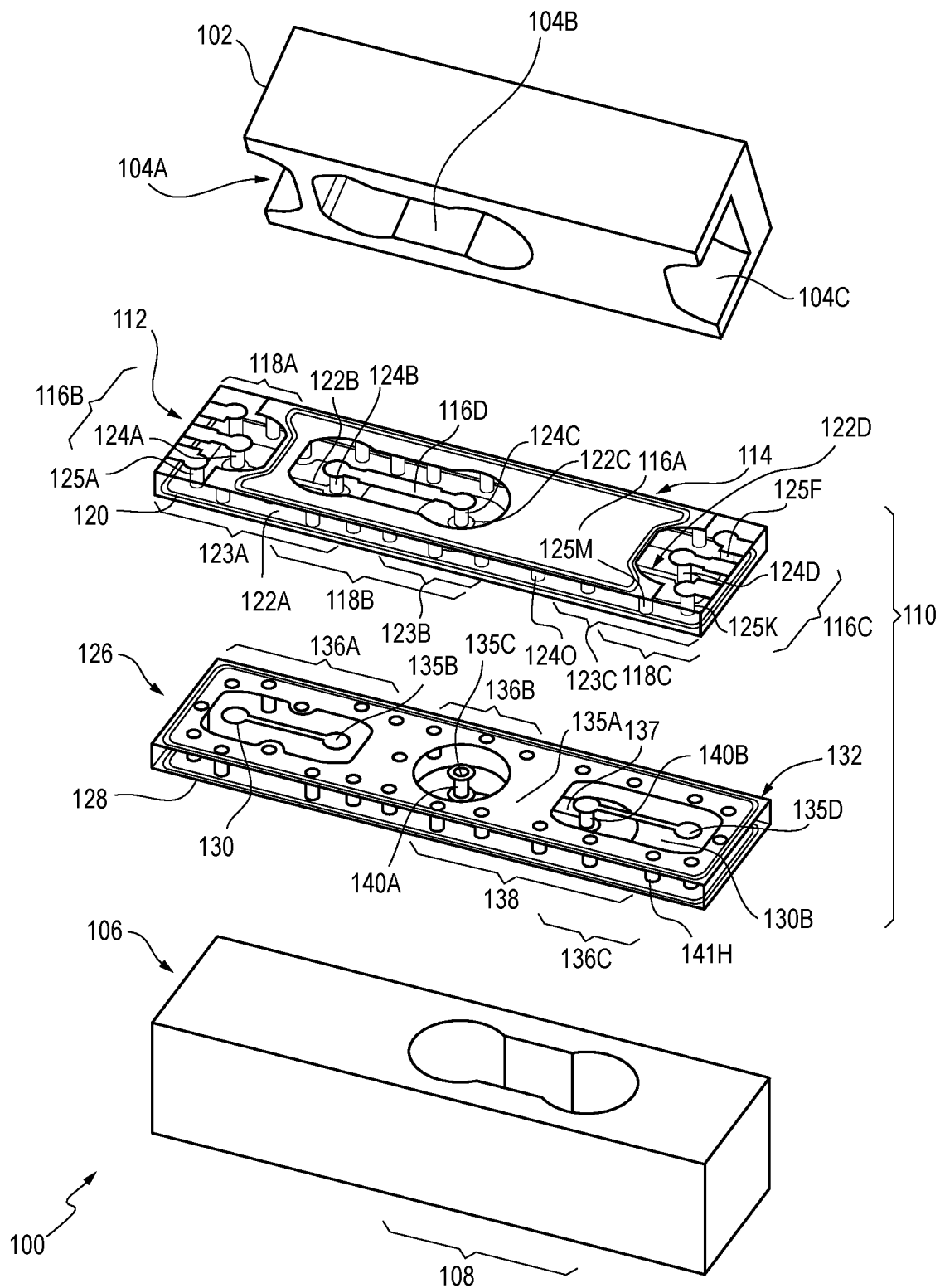
FIGS. 1A-1H are a set of eight drawings of a microelectronics H-Frame device.

FIG. 1A shows an exploded view of a microelectronics H-frame device 100.

The microelectronics H-frame device 100 comprises a top cover 102. For example, the top cover 102 comprises a semiconductor.

For example, and as depicted, the top cover 102 comprises three top cover cavities 104A-104C, a first top cover cavity 104A, a second top cover cavity 104B, and a third top cover cavity 104C. The first top cover cavity 104A comprises a partial first top cover cavity 104A. The second top cover cavity 104B comprises a fully formed second top cover cavity 1046. The third top cover cavity 104C comprises a partial third top cover cavity 104C.

For example, as discussed below in further detail, the top cover 102 is micro-machined to form one or more of the top cover cavities 104A-104C. For example, as discussed below in further detail, the top cover 102 is plated to form one or more of the top cover cavities 104A-104C. For example, the top cover 102 is plated using gold to form one or more of the top cover cavities 104A-104C.

The microelectronics H-frame device 100 further comprises a bottom cover 106. For example, the bottom cover 106 comprises a semiconductor. The bottom cover 106 comprises one or more bottom cover cavities 108. For example, and as depicted, the bottom cover 106 comprises one bottom cover cavity 108. For example, as discussed below in further detail, the bottom cover 106 is micro-machined to form the bottom cover cavity 108. For example, as discussed below in further detail, the bottom cover 106 is plated to form the bottom cover cavity 108. For example, the bottom cover 106 is plated using gold to form the bottom cover cavity 108.

The microelectronics H-frame device 100 further comprises a substrate 110. Preferably, but not necessarily, the substrate 110 comprises a substantially planar substrate 110. Preferably, but not necessarily, the substrate 110 is configured to be encapsulated between the bottom cover 106 and the top cover 102. For example, the substrate 110 has a thickness between approximately 200 microns and approximately 800 microns.

The substrate 110 comprises a top substrate 112. Preferably, but not necessarily, the top substrate 112 comprises silicon carbide (SiC).

The top substrate 112 is operably connected to the top cover 102. Preferably, the top substrate 112 is bonded to the top cover 102. The top substrate 112 comprises a top substrate top surface 114. Preferably, but not necessarily, the top substrate top surface 114 comprises circuit components of the H-frame device 100 such as, for example, one or more of transistors, resistors, capacitors, and transmission lines.

Preferably, but not necessarily, the top substrate top surface 114 comprises a first bonding interface 114 at which the top substrate 112 is physically bonded to the top cover 102. Preferably, but not necessarily, the top substrate 112 is physically bonded to the top cover 102. For example, the top substrate 112 is physically bonded to the top cover 102 at the top substrate top surface 114. For example, gold-gold compression bonding is used to physically attach the top substrate 112 to the top cover 102 at the top substrate top surface 114. For example, a first adhesive (not shown in FIG. 1A) physically attaches the top substrate 112 to the top cover 102 at the top substrate top surface 114. For example, the first adhesive comprises epoxy. For example, the first adhesive comprises electrically conductive epoxy. For example, the first adhesive comprises gold which can be compression bonded to gold on the top cover 102.

Preferably, but not necessarily, the top substrate top surface 114 is configured to support a top substrate top metallization 116. For example, the top substrate top metallization 116 has a thickness between approximately 1 micron and approximately 13 microns. For example, the top substrate top metallization 116 has a thickness of approximately 3.5 microns. For example, the top substrate top metallization 116 has a thickness of approximately 5.5 microns. The top substrate top metallization 116 comprises a top substrate top ground plane 116A that is used as one or more of a reference conductor and a "ground conductor in the H-frame device 100. The top substrate top metallization 116B comprises a first input/output port 116B, discussed in more detail below in FIG. 1C. The top substrate top metallization 116C comprises a second input/output port 116C, also discussed in more detail below in FIG. 1C. The top substrate top metallization 116D comprises a first top substrate top signal line 116D configured to conduct a signal.

The top substrate top metallization 116 comprises one or more top substrate top metallization openings 118A-118C. For example, and as depicted, the top substrate top metallization 116 comprises three top substrate top metallization openings 118A-118C, a first top substrate top metallization opening 118A, a second top substrate top metallization opening 1186, and a third top substrate top metallization opening 118C. The first top substrate top metallization opening 118A comprises a partial first top substrate top metallization opening 118A. The second top substrate top metallization opening 118B comprises a fully formed second top substrate top metallization opening 118B. The third top substrate top metallization opening 118C comprises a partial third top substrate top metallization opening 118C.

As described below in more detail, the first top substrate top metallization opening 118A is designed so as to approximately align with the first top cover cavity 104A. Similarly, as described below in more detail, the second top substrate top metallization opening 118B is designed so as to approximately align with the second top cover cavity 104B. As described below in more detail, the third top substrate metallization opening 118C is designed so as to approximately align with the third top cover cavity 104C.

The top substrate 112 further comprises a top substrate bottom surface 120. The top substrate bottom surface 120 comprises a top substrate bottom ground plane 122A that is used as one or more of a reference conductor and a ground conductor in the H-frame device 100.

Preferably, but not necessarily, the top substrate bottom surface 120 is configured to support a top substrate bottom metallization 122. For example, the top substrate bottom metallization 122 has a thickness between approximately 1 micron and approximately 13 microns. For example, the top substrate bottom metallization 122 has a thickness of approximately 3.5 microns. For example, the top substrate bottom metallization 122 has a thickness of approximately 5.5 microns. The top substrate bottom metallization 122 comprises the top substrate bottom ground plane 122A, a first top substrate bottom signal line 122B, a circular top substrate bottom metallization via pad 122C, and a second top substrate bottom signal line 122D. These three top substrate bottom metallizations 122B, 122C, and 122D are described in more detail in FIGS. 2A and 2B.

The top substrate bottom metallization 122 comprises one or more top substrate bottom metallization openings 123A-123C. For example, and as depicted, the top substrate bottom metallization 122 comprises three top substrate bottom metallization openings 123A-123C, a first top substrate bottom metallization opening 123A, a second top substrate bottom metallization opening 123B, and a third top substrate bottom metallization opening 123C.

The top substrate 112 further comprises a plurality of metallized top substrate through-substrate vias 124A-124D, the top substrate through-substrate vias 124A-124D configured to provide a vertical electrical connection between the top substrate top metallization 116 and the top substrate bottom metallization 122. Bonding of the top cover 102 to the top substrate 112 creates a vertical electrical connection between the top substrate 112 and the top cover 102.

As described below in more detail, the top substrate through-substrate signal vias 124A-124D are preferably hermetically sealed, electrical feed-through vias. The top substrate through-substrate vias 124A-124D are preferably formed, as described below in more detail, by etching through the top substrate 112 and plating an interior wall of a void produced by the etching. A top surface of at least one of the top substrate through-substrate vias 124A-124D is preferably sealed. For example, a top surface of all of the top substrate through-substrate vias 124A-124D is preferably sealed using gold. For example, a top surface of all of the top substrate through-substrate vias 124A-124D is preferably sealed using gold.

For example, a top surface of at least one of the top substrate through-substrate vias 124A-124D is preferably sealed using a solid cap comprising gold. The top substrate through-substrate vias 124A-124D comprise a first top substrate through-substrate via 124A, a second top substrate through-substrate via 124B, a third top substrate through-substrate via 124C, and a fourth top substrate through-substrate via 124D. As described below in more detail, the top substrate through-substrate vias 124A-124D are preferably hermetically sealed, electrical feed-through vias. The top substrate through-substrate vias 124A-124D are preferably formed, as described below in more detail, by etching through the top substrate 112 and plating an interior wall of a void produced by the etching. A top surface of at least one of the top substrate through-substrate vias 124A-124D is preferably sealed. For example, a top surface of at least one of the top substrate through-substrate vias 124A-124D is preferably sealed using gold. Functions of the second top substrate through-substrate via 124B and the third top substrate through-substrate via 124E are described in more detail in FIGS. 2A and 2B.

The top substrate 112 further comprises a plurality of top substrate ground vias 125A-125O, the top substrate ground vias 125A-125O configured to provide electrical grounding. The top substrate ground vias 125A-125O comprise a first top substrate ground via 125A, a second top substrate ground via 125F, and a third top substrate ground via 125K. Functions of the first top substrate ground via 125A, the second top substrate ground via 125F, the third top substrate ground via 125K, and the fourth top substrate ground via 125M are described in more detail in FIGS. 1C, 1D, 1E, and 2A.

The substrate 110 further comprises a bottom substrate 126. Accordingly, the substrate 110 comprises a stack of the top substrate 112 and the bottom substate 126. More generally, the substrate 110 comprises a stack of two or more substrates. The device 100 further comprises metallization located between the top substrate 112 and the bottom substrate 126.

Preferably, but not necessarily, the bottom substrate 126 comprises silicon carbide (SiC).

The bottom substrate 126 is operably connected to the bottom cover 106. Preferably, the bottom substrate 126 is bonded to the bottom cover 106. The bottom substrate 126 comprises a bottom substrate bottom surface 128. Preferably, but not necessarily, the bottom substrate bottom surface 128 comprises circuit components of the H-frame device 100 such as, for example, one or more of transistors, capacitors, and transmission lines. Preferably, but not necessarily, the bottom substrate bottom surface 128 comprises a second bonding interface 128 at which the bottom substrate 126 is physically bonded to the bottom cover 106. Preferably, but not necessarily, the bottom substrate 126 is physically bonded to the bottom cover 106. For example, the bottom substrate 126 is physically bonded to the bottom cover 106 at the bottom substrate bottom surface 128. For example, gold-gold pressuring bonding is used to physically attach the top substrate 112 to the bottom cover 106 at the bottom substrate bottom surface 128. For example, a second adhesive (not shown in FIG. 1A) physically attaches the bottom substrate 126 to the bottom cover 106 at the bottom substrate bottom surface 128. For example, the second adhesive comprises epoxy.

Preferably, but not necessarily, the bottom substrate bottom surface 128 is configured to support a bottom substrate bottom metallization 130. For example, the bottom substrate bottom metallization 130 has a thickness between approximately 1 micron and approximately 13 microns. For example, the bottom substrate bottom metallization 130 has a thickness of approximately 3.5 microns. For example, the bottom substrate bottom metallization 130 has a thickness of approximately 5.5 microns.

The bottom substrate 126 further comprises a bottom substrate top surface 132. The bottom substrate top surface 132 is bonded to the top substrate bottom surface 120. As described below in more detail, the bottom substrate top surface 132 is bonded to the top substrate bottom surface 120 using a plurality of bonding bumps comprised in both the bottom substrate top surface 132 and the top substrate bottom surface 120.

The bottom substrate top surface 132 and the top substrate bottom surface 120 meet at a third bonding interface 134. Preferably, but not necessarily, the bottom substrate top surface 132 is configured to support a bottom substrate top metallization 135.

The bottom substrate top metallization 135 comprises a bottom substrate top ground plane 135A, a first bottom substrate top signal line 135B, a circular bottom substrate top metallization via pad 135C, and a second bottom substrate top signal line 135D. Together the first top substrate bottom signal line 122B and the first bottom substrate top signal line 135B form a first mid-substrate signal line 122B-135B, which is the stripline 122B-135B that the escape transition (not shown in FIG. 1A; item 210 in FIG. 2A) uses to connect an inner side of the device 100 and an outer side of the device 100.

The bottom substrate top metallization 135 comprises one or more bottom substrate top metallization openings 136A-136C. For example, and as depicted, the bottom substrate top metallization 135 comprises three bottom substrate top metallization openings 136A-136C, a first bottom substrate top metallization opening 136A, a second bottom substrate top metallization opening 136B, and a third bottom substrate top metallization opening 136C.

As described below in more detail, the first bottom substrate top metallization opening 136A is configured so as to approximately align with the first top substrate bottom cavity 123A. Similarly, the second bottom substrate top metallization opening 136B is configured so as to approximately align with the second top substrate bottom cavity 123B. Again, the third bottom substrate top metallization opening 136C is configured so as to approximately align with the third top substrate bottom cavity 123C. In designing the H-frame device 100, the first top substrate bottom cavity 123A is approximately matched in shape to the first bottom substrate top metallization opening 136A. Similarly, in designing the H-frame device 100, the second top substrate bottom cavity 123B is approximately matched in shape to the second bottom substrate top metallization opening 136B. Again, in designing the H-frame device 100, the third top substrate bottom cavity 123C is approximately matched in shape to the third bottom substrate top metallization opening 136C.

For example, the bottom substrate top metallization 135 has a thickness between approximately 1 micron and approximately 13 microns. For example, the bottom substrate top metallization 135 has a thickness of approximately 3.5 microns. For example, the bottom substrate top metallization 135 has a thickness of approximately 5.5 microns. The bottom substrate top metallization 135 is preferably in electrical contact with the top substrate bottom metallization 122, thereby creating a vertical electrical connection between the top substrate bottom metallization 122 and the bottom substrate top metallization 135. Bonding of the bottom cover 106 to the bottom substrate 126 creates a first vertical electrical connection between the bottom substrate 126 and the bottom cover 106.

Using the first vertical electrical connection, the top substrate top metallization 116 is electrically connected to the top substrate bottom metallization 122 at an outer side of the top cover 102. A shape in the top substrate bottom metallization 122 connects the first vertical electrical connection at an outer side of the top cover 102 to a first vertical electrical connection at an inner side of the top cover 102. Using the first vertical electrical connection, the top substrate bottom metallization 122 is electrically connected to the top substrate top metallization 116 on an inner side of the top cover 102.

Using the second vertical electrical connection, the bottom substrate bottom metallization 130 is electrically connected to the bottom substrate top metallization 135 at an inner side of the bottom cover 106.

The bottom substrate bottom metallization 130 further comprises a bottom substrate bottom signal line 137 configured to conduct a signal.

The bottom substrate bottom metallization 130 comprises one or more bottom substrate bottom metallization openings 138. As depicted, the bottom substrate metallization 130 comprises one bottom substrate bottom metallization opening 138. The bottom substrate bottom metallization opening 138 comprises a fully formed bottom substrate bottom metallization opening 138.

As described below in more detail, the bottom substrate bottom metallization opening 138 is designed so as to approximately align with the bottom cover cavity 108.

The bottom substrate 126 further comprises a plurality of bottom substrate through-substrate vias 140A-140B, the bottom substrate through-substrate vias 140A-140B configured to provide a second vertical electrical connection between the bottom substrate top metallization 135 and the bottom substrate bottom metallization 130. Bonding of the bottom cover 106 to the bottom substrate 126 creates the second vertical electrical connection between the bottom substrate 126 and the bottom cover 106.

As described below in more detail, the bottom substrate through-substrate vias 140A-140B are preferably hermetically sealed, electrical feed-through vias. The bottom substrate through-substrate vias 140A-140B are preferably formed, as described below in more detail, by etching through the top substrate 112 and plating an interior wall of a void produced by the etching. A top surface of at least one of the bottom substrate through-substrate vias 140A-140B is preferably sealed. For example, a top surface of at least one of the bottom substrate through-substrate vias 140A-140B is preferably sealed using gold. For example, a top surface of at least one of the bottom substrate through-substrate vias 140A-140B is preferably sealed using a solid cap comprising gold. For example, a top surface of at least one of the bottom substrate through-substrate vias 140A-140B is preferably sealed using a solid cap consisting of gold.

The bottom substrate through-substrate vias 140A-140B comprise a first bottom substrate signal via 140A and a second bottom substrate through-substrate via 140B. These two bottom substrate through-substrate vias 140A and 140B are described in more detail in FIGS. 1H, 2A, and 2G.

The bottom substrate 126 further comprises a plurality of bottom substrate ground vias 141A-141N, the bottom substrate ground vias 141A-141N configured to provide electrical grounding. The bottom substrate ground vias 141A-141N comprise a first bottom substrate ground via 141A, a second bottom substrate ground via 141F, and a third bottom substrate ground via 141H. Functions of the first bottom substrate ground via 141A, the second bottom substrate ground via 141F, and the third bottom substrate ground via 141H are described in more detail in FIGS. 1H, 2A, and 2B.

Figure 1B:
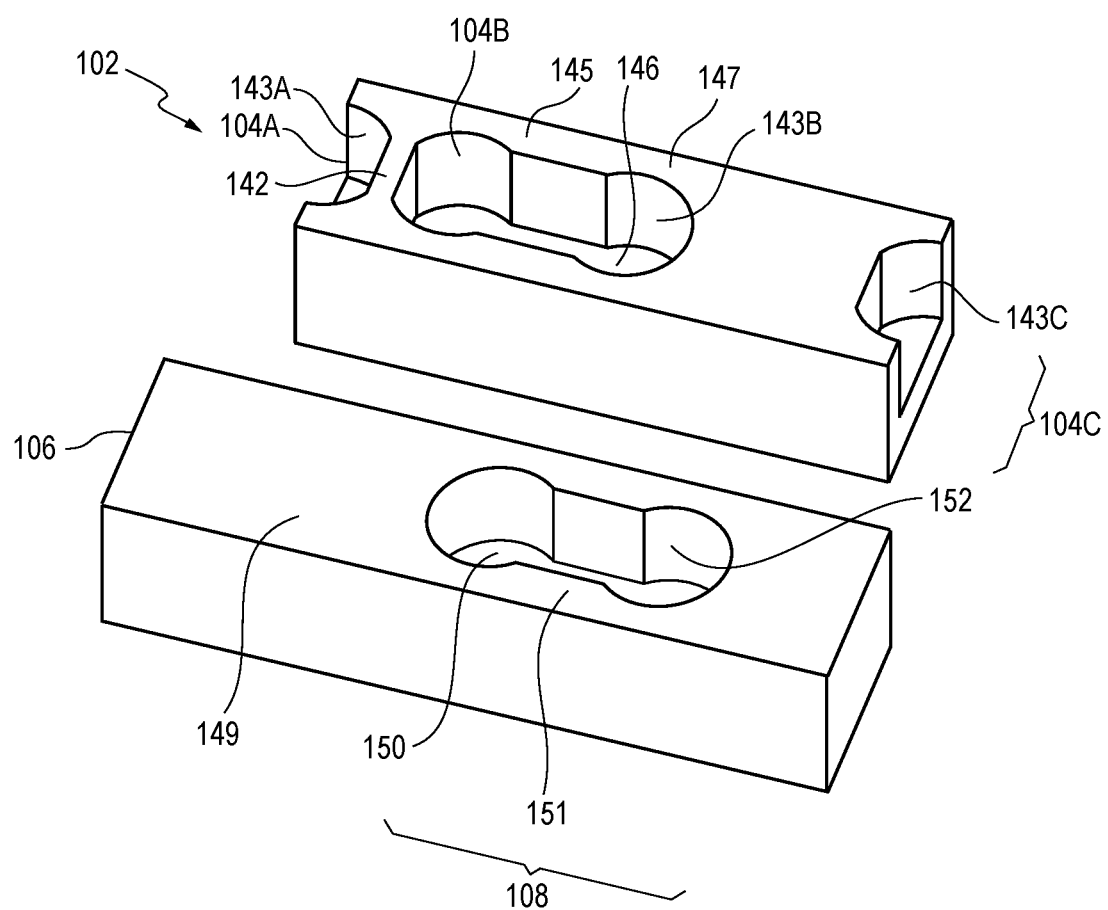

FIG. 1B shows a detail view of the top cover 102 and the bottom cover 106.

The top cover 102 again comprises the first top cover cavity 104A, the second top cover cavity 104B, and the third top cover cavity 104C.

The first top cover cavity 104A again comprises the partial first top cover cavity 104A. The partial first top cover cavity 104A comprises a top first cavity wall 143A. The top first cavity wall 143A will be visible after the top cover 102 is bonded to the substrate 110 as described in more detail below.

The second top cover cavity 104B again comprises the fully formed second top cover cavity 104B. The second top cover cavity 104B comprises a second top cavity wall 143B.

The third top cover cavity 104C again comprises the partial third top cover cavity 104C. The partial third top cover cavity 104C comprises a top third cavity wall 143C. The top third cavity wall 143C will be visible after the top cover 102 is bonded to the substrate 110 as described in more detail below.

The top cover 102 further comprises top cover metallization 145. The top cover metallization 145 grounds the top cover 102. The top cover metallization 145 thereby provides an integral part of the overall grounding structure of the microelectronics H-frame device 100. For example, the top cover metallization 145 comprises a singly-connected top cover metallization 145. For example, as discussed below in more detail, the top cover metallization 145 is produced by performing gold plating on a micromachined silicon wafer.

The top cover metallization 145 comprises a metallized top cavity floor 146. The second top cover cavity 104B comprises the metallized top cavity floor 146. Upon bonding of the top cover 102 to the top substrate 120, the metallized top cavity floor 146 becomes a top cover ceiling 146 of the top cover 102.

The top cover metallization 145 further comprises a metallized top cover top surface 147. As described below in more detail, during fabrication of the device (item 100 in FIG. 1A), the metallized top cover top surface 147 Is bonded to bumps on the top substrate top surface 114 to complete bonding.

The top cover metallization 145 further comprises a metallized second top cavity wall 143B. The second top cover cavity 104B comprises the metallized second top cavity wall 143B.

The bottom cover 106 further comprises bottom cover metallization 149. The bottom cover metallization 149 grounds the top cover 102. The bottom cover metallization 149 thereby provides an integral part of the overall grounding structure of the microelectronics H-frame device (item 100 in FIG. 1A). For example, the bottom cover metallization 149 comprises a singly-connected bottom cover metallization 149. For example, as discussed below in more detail, the bottom cover metallization 149 is produced by performing gold plating on a micromachined silicon wafer.

The bottom cover metallization 149 comprises a metallized bottom cavity floor 150. The bottom cover cavity 108 comprises the metallized bottom cavity floor 150. Upon bonding of the bottom cover 106 to the bottom substrate 126, the metallized bottom cavity floor 150 becomes a floor 150 of the bottom cover 106.

The bottom cover metallization 149 further comprises a metallized bottom cover top surface 151. As described below in more detail, during fabrication of the device (item 100 in FIG. 1A), the metallized bottom cover top surface 151 Is bonded to bumps on the bottom substrate bottom surface (item 128 in FIG. 1A) to complete bonding.

The bottom cover metallization 149 further comprises a metallized bottom cavity wall 152. The bottom cover cavity 108 comprises the metallized bottom cavity wall 152.

Figure 1C:
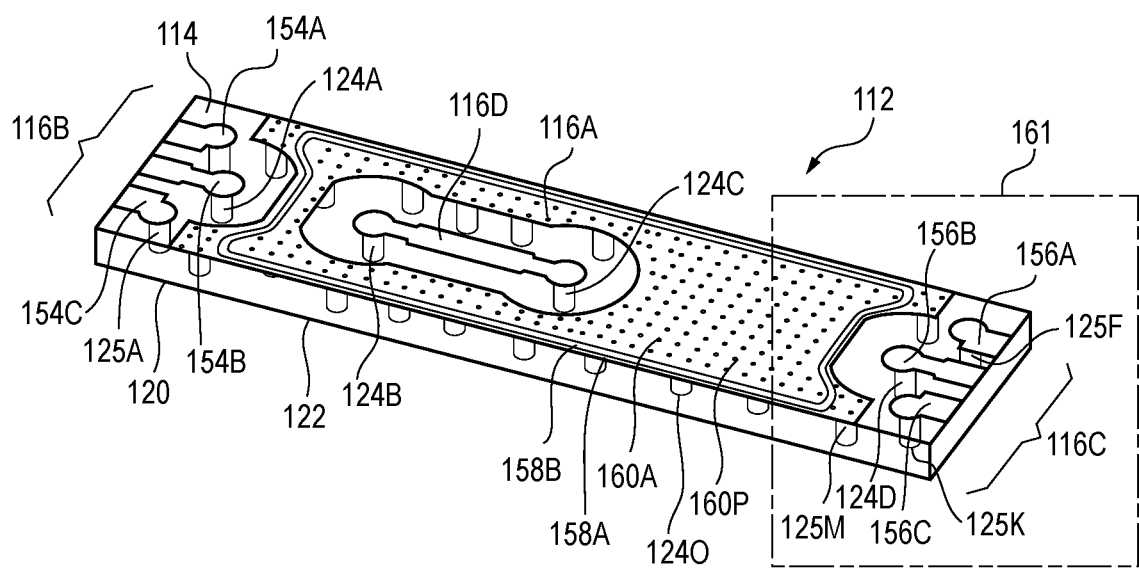

FIG. 1C shows a detailed view of the top substrate 112. The top substrate 112 again comprises the top substrate top surface 114, the top substrate top metallization 116, the top substrate bottom surface 120, the top substrate through-substrate vias 124A-124D, and the top substrate ground vias 125A, 125F, 125K, and 125M. The top substrate bottom surface 120 again comprises the top substrate bottom metallization 122. (Details of the top substrate bottom metallization 122 are not visible in FIG. 1C but are discussed in more detail in FIGS. 2A and 2B.)

The top substrate top metallization 116 again comprises the top substrate top ground plane 116A, the first input/output port 116B, the second input/output port 116C, and the first top substrate top signal line 116D.

The top substrate 112 again further comprises the first input/output port 116B. Preferably, although not necessarily, the top substrate top surface 114 comprises the first input/ output port 116B. The first input/output port 116B is configured to do one or more of receive an input signal and transmit an output signal. The first input/output port 116B comprises a first port first ground metal pad 154A, a first port signal metal pad 154B, and a first port second ground metal pad 154C. The first port signal metal pad comprises a second signal line 154B.

The first port first ground metal pad 154A is operably connected to the top substrate bottom surface 120 by one or more of the top substrate through-substrate vias 124A-124D. The first port second ground metal pad 154C is operably connected to the top substrate ground plane 120 by one or more of the top substrate through-substrate vias 124A-124D.

The top substrate 112 further comprises the second input/output port 116C. Preferably, although not necessarily, the top substrate top surface 114 comprises the second input/output port 116C. The second input/output port 116C is configured to do one or more of receive an input signal and transmit an output signal. The second input/output port 116C comprises a second port first ground metal pad 156A, a second port signal metal pad 156B, and a second port second ground metal pad 156C. The second port signal metal pad comprises a third signal line 156B.

The second port first ground metal pad 156A is operably connected to the top substrate bottom surface 120 by one or more of the top substrate through-substrate vias 124A-124D. The second port second ground metal pad 156C is operably connected to the top substrate bottom surface 120 by one or more of the top substrate through-substrate vias 124A-124D.

The top substrate top metallization 116 further comprises one or more top substrate top metallization continuous bumps 158A-158B. As depicted, the top substrate top metallization 116 comprises two top substrate top metallization concentric continuous bumps 158A, 158B, the concentric top substrate top metallization continuous bumps 158A, 158B usable for bonding the top substrate 112 to the top cover 102. Preferably, the concentric top substrate top metallization continuous bumps 158A, 158B are spaced so as to be separated by less than approximately 0.1 wavelength of the highest frequency of interest.

The top substrate top metallization 116 further comprises one or more top substrate top metallization discrete bumps 160A-160P, the top substrate top metallization discrete bumps 160A-160P usable for bonding the top substrate 112 to the top cover 102. Preferably, the top substrate top metallization discrete bumps 160A-160P are spaced so as to be separated by less than approximately 0.1 wavelength of the highest frequency of interest.

Preferably, the top substrate top metallization continuous bumps 158A, 158B are configured to provide an environmental seal configured to prevent foreign particles from entering the top cover 102 after formation of the bond at the top substrate top surface 114, thereby protecting the H-frame device 100.

Preferably, the top substrate top metallization discrete bumps 160A-160P are configured to provide an environmental seal configured to prevent foreign particles from entering the top cover 102 after formation of the bond at the top substrate top surface 114, thereby protecting the H-frame device 100.

Figure 1D:
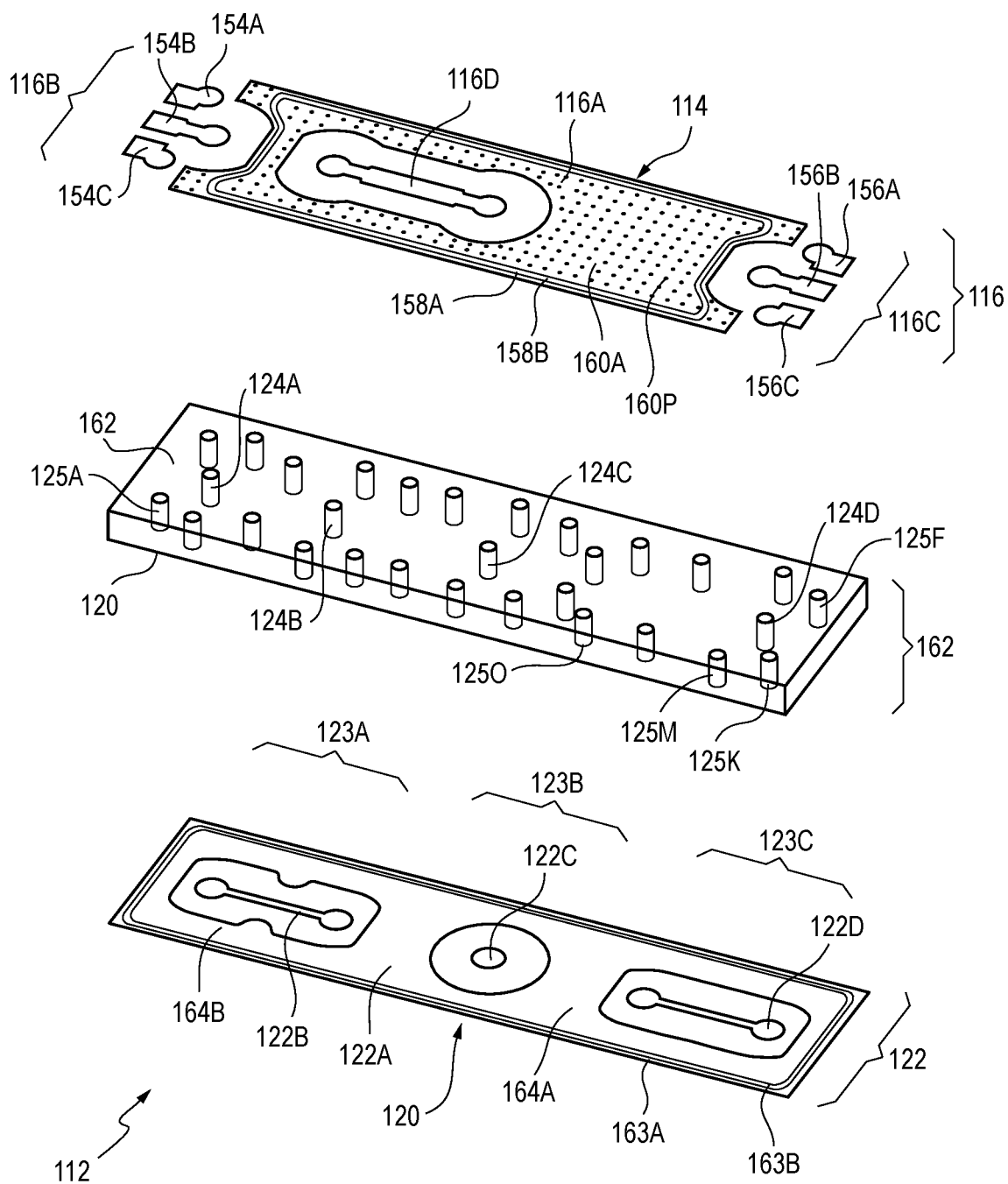
Figure 1E:
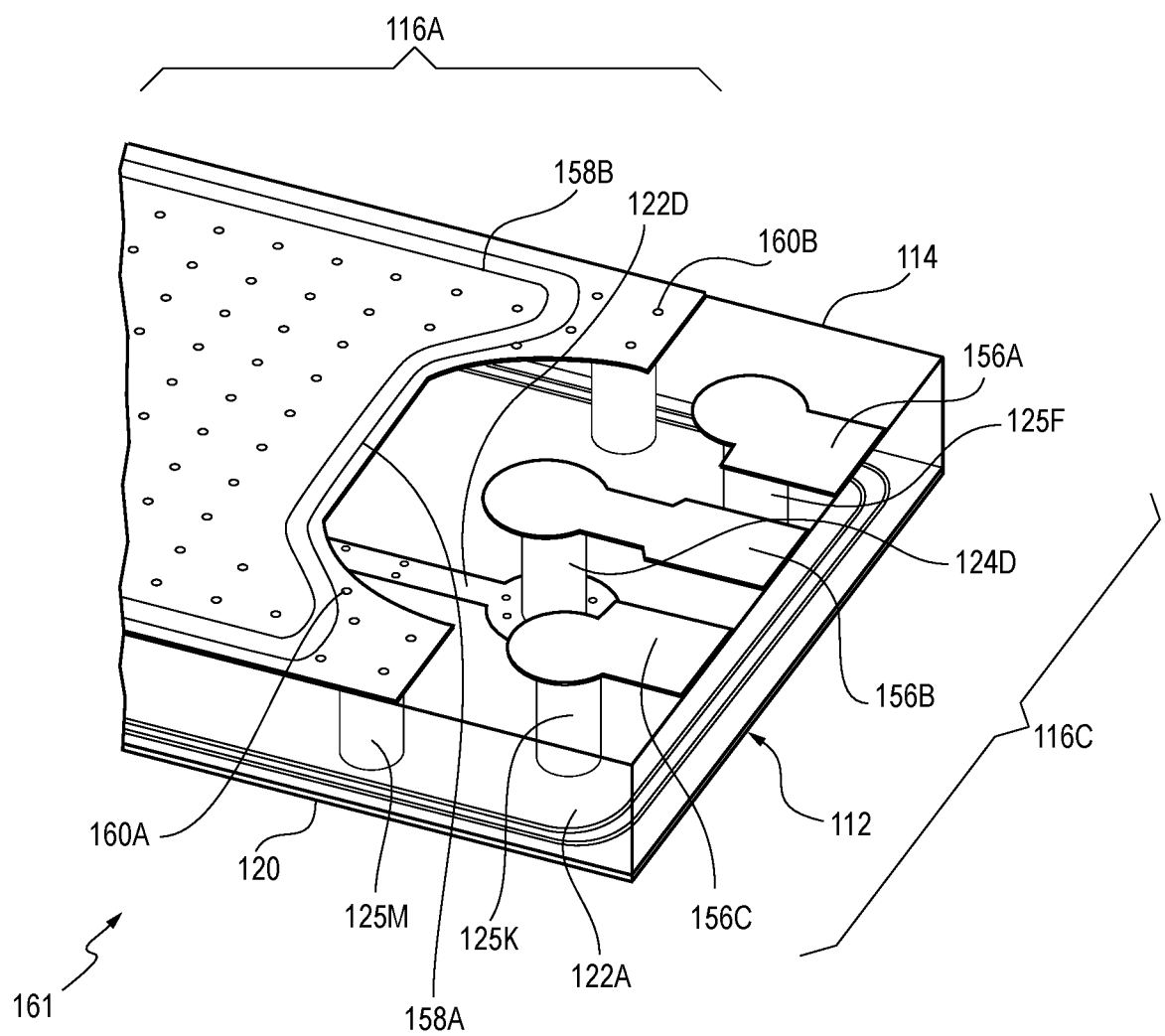

Dotted line 161 in FIG. 1C is the boundary of a detail view of the device provided and discussed in more detail in FIG. 1E.

FIG. 1D shows an exploded view of the top substrate 112. The top substrate 112 comprises the top substrate top metallization 116, the top substrate bottom metallization 122, and a top dielectric 162. The top dielectric 162 comprises an electrical insulator 162. The top substrate top metallization 116 again comprises the top substrate through-substrate vias 124A-124D, the top substrate ground vias 125F, 125K, and 125M, the top substrate top metallization continuous bumps 158A-158B and the top substrate top metallization discrete bumps 160A-160P.

Also shown again are the top substrate top surface 114, the top substrate bottom surface 120, and the top substrate through-substrate vias 124A-124D.

The top substrate top metallization 116 further comprises the first input/output port 116B. The top substrate top metallization 116 further comprises the second input/output port 116C.

The top dielectric 162 comprises the top substrate top surface 114, the top substrate bottom surface 120, and the top substrate through-substrate vias 124A-124D.

The first input/output port 1166 again comprises the first port first ground metal pad 154A, the first port signal metal pad 1546, and the first port second ground metal pad 154C. The first port first ground metal pad 154A is again operably connected to the top substrate bottom ground plane 122A by one or more of the top substrate through-substrate vias 124A-124D. The first port second ground metal pad 154C is operably connected to the top substrate ground plane 122A by one or more of the top substrate through-substrate vias 124A-124D.

The second input/output port 116C again comprises the second port first ground metal pad 156A, the second port signal metal pad 156B, and the second port second ground metal pad 156C. The second port first ground metal pad 156A is again operably connected to the top substrate bottom ground plane 122A by one or more of the top substrate through-substrate vias 124A-124D. The second port second ground metal pad 156C is again operably connected to the top substrate ground plane 122A by one or more of the top substrate through-substrate vias 124A-124D.

The top substrate bottom metallization 122 comprises a top substrate bottom ground plane 122A that is grounded. The top substrate bottom metallization 122 comprises a first top substrate bottom signal line 122B configured to conduct a signal. The top substrate bottom metallization 122 again comprises the first top substrate bottom metallization opening 123A, the second top substrate bottom metallization opening 123B, and the third top substrate bottom metallization opening 123C.

In designing the H-frame device 100, the first top substrate bottom signal line 122B is approximately matched in shape to the bottom substrate top signal line (not shown in FIG. 1D; item 135B shown in FIG. 1A). The first top substrate bottom signal line 122B is bonded at the third bonding interface 134 to the bottom substrate top signal line (not shown in FIG. 1D; item 1356 shown in FIG. 1A) using a plurality of bonding bumps (not shown in FIG. 1D). Together the first top substrate bottom signal line 122B and the first bottom substrate top signal line (not shown in FIG. 1D; item 1356 shown in FIG. 1A) form the first mid-substrate signal line 122B-135B, which is the stripline 122B-135B that the escape transition (not shown in FIG. 1A; item 210 in FIG. 2A) uses to connect an inner side of the device 100 and an outer side of the device 100.

In designing the H-frame device 100, the circular top substrate bottom metallization via pad 122C is approximately matched in shape to the circular bottom substrate top metallization via pad (not shown in FIG. 1D; item 135C shown in FIG. 1A). The circular top substrate bottom metallization via pad 122C is bonded at the third bonding interface 134 to the circular bottom substrate top metallization via pad (not shown in FIG. 1D; item 135C shown in FIG. 1A) using a plurality of bonding bumps (not shown in FIG. 1D). Together, circular top substrate bottom metallization via pad 122C and the circular bottom substrate top metallization via pad (not shown in FIG. 1D; item 135C shown in FIG. 1A) form a via pad 122C-135C, helping to provide one or more of an electrical connection and electrical fencing.

The top substrate bottom metallization 122 again further comprises the circular top substrate bottom metallization 122C and the second top substrate bottom signal line 122D.

The top substrate bottom metallization 122 further comprises one or more top substrate bottom metallization continuous bumps 163A-163B. As depicted, the top substrate bottom metallization 122 comprises two concentric top substrate bottom metallization continuous bumps 163A, 163B, the concentric top substrate bottom metallization continuous bumps 163A, 163B usable for bonding the top substrate 112 to the bottom substrate 126. Preferably, the concentric top substrate bottom metallization continuous bumps 163A, 163B are spaced so as to be separated by less than approximately 0.1 wavelength of the highest frequency of interest.

The top substrate bottom metallization 122 further comprises one or more top substrate bottom metallization discrete bumps 164A-164P, the top substrate bottom metallization discrete bumps 164A-164P usable for bonding the top substrate 112 to the bottom substrate 126. Preferably, the top substrate bottom metallization discrete bumps 164A-164P are spaced so as to be separated by less than approximately 0.1 wavelength of the highest frequency of interest.

Preferably, the top substrate bottom metallization continuous bumps 163A, 163B are configured to provide an environmental seal configured to prevent foreign particles from entering the substrate 110 after formation of the bond at the top substrate bottom surface 120, thereby protecting the H-frame device 100.

Preferably, the top substrate bottom metallization discrete bumps 164A-164P are configured to provide an environmental seal configured to prevent foreign particles from entering the substrate 110 after formation of the bond at the top substrate bottom surface 120, thereby protecting the H-frame device 100.

FIG. 1E shows a detail view of a portion 161 of FIG. 1C, showing a portion of the top substrate 112. Dotted line 161 in FIG. 1C is the boundary of the detail view of the device shown in FIG. 1E.

The top substrate 112 again comprises the top substrate top surface 114, the top substrate top metallization 116A and 116C, the top substrate bottom surface 120, and the top substrate through-substrate vias 124A-124D, and the top substrate ground vias 125F, 125K, and 125M.

The top substrate 112 again further comprises the second input/output port 116C. Preferably, although not necessarily, the top substrate top surface 114 comprises the second input/output port 116C. The second input/output port 116C again comprises a second port first ground metal pad 156A, a second port signal metal pad 156B, and a second port second ground metal pad 156C.

The second port first ground metal pad 156A is operably connected to the top substrate bottom ground plane 122A by the second top substrate ground via 125F. The second port second signal metal pad 156B is operably connected to the second top substrate bottom signal line 122D by the fourth top substrate signal via 12D. The fourth top substrate through-substrate via 124D comprises a hot top substrate through-substrate via 124D usable in a transition. The second port third top metal pad 156C is operably connected to the top substrate bottom ground plane 122A by the third top substrate ground via 125K. The third top substrate ground via 125K is configured to provide general grounding of one or more of the top substrate 112 and the H-frame device 100. The fourth top substrate ground via 125M is configured to provide general grounding of one or more of the top substrate 112 and the H-frame device 100.

The top substrate top metallization 116 again further comprises one or more top substrate top metallization continuous bumps 158A-158B. As depicted, the top substrate top metallization 116 comprises two concentric top substrate top metallization continuous bumps 158A, 158B, the concentric top substrate top metallization continuous bumps 158A, 158B usable for bonding the top substrate 112 to the top cover 102. Preferably, the top substrate top metallization concentric continuous bumps 158A, 158B are spaced so as to be separated by less than approximately 0.1 wavelength of the highest frequency of interest.

The top substrate top metallization 116 again further comprises the one or more top substrate top metallization discrete bumps 160A-160P, the top substrate top metallization discrete bumps 160A-160P usable for bonding the top substrate 112 to the top cover 102. Preferably, the discrete bumps 160A-160P are spaced so as to be separated by less than approximately 0.1 wavelength of the highest frequency of interest.

Preferably, the top substrate top metallization continuous bumps 158A, 158B are again configured to provide an environmental seal configured to prevent foreign particles from entering the top cover 102 after formation of the bond at the top substrate top surface 114, thereby protecting the H-frame device 100.

Figure 1F:
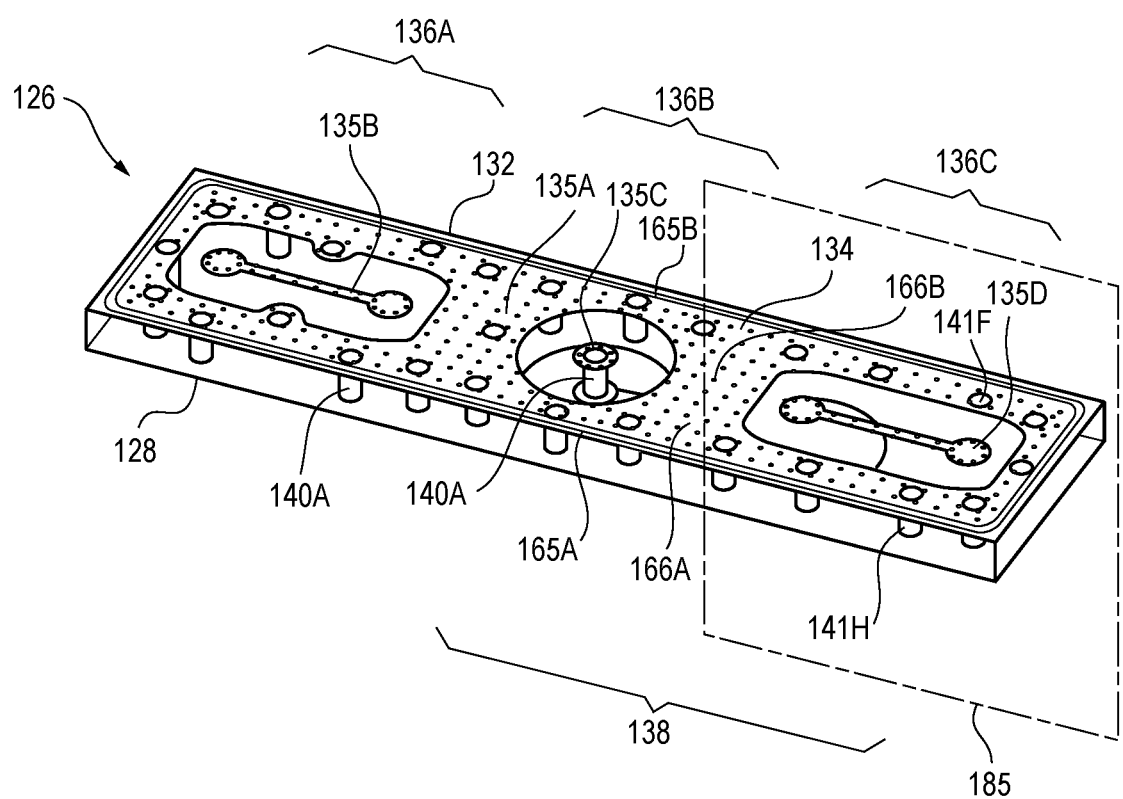

FIG. 1F shows a detailed view of the bottom substrate 126. The bottom substrate 126 again comprises the bottom substrate bottom surface 128, the bottom substrate top surface 132, the bottom substrate top metallization 135 (shown in more detail here so accordingly four bottom substrate top metallization regions are shown here), the bottom substrate bottom metallization opening 138, the bottom substrate through-substrate vias 140A and 140B, and the bottom substrate ground vias 141F and 141H. The bottom substrate top surface 132 again comprises the bottom substrate top metallization 135. The bottom substrate top metallization 135 again comprises the first bottom substrate first metallization opening 136A, the second bottom substrate top metallization opening 136B, and the third bottom substrate top metallization opening 136C.

The bottom substrate top metallization 135A further comprises one or more bottom substrate top metallization continuous bumps 165A-165B. As depicted, the bottom substrate top metallization 135A comprises two concentric bottom substrate top metallization continuous bumps 165A, 165B, the concentric bottom substrate top metallization continuous bumps 165A, 165B usable for bonding the bottom substrate 126 to the top substrate 112. Preferably, the concentric bottom substrate top metallization continuous bumps 165A, 165B are spaced so as to be separated by less than approximately 0.1 wavelength of the highest frequency of interest.

The bottom substrate top metallization 135A further comprises one or more bottom substrate top metallization discrete bumps 166A-166P, the bottom substrate top metallization discrete bumps 166A-166P usable for bonding the bottom substrate 126 to the top substrate 112. Preferably, the bottom substrate top metallization discrete bumps 166A-

166P are spaced so as to be separated by less than approximately 0.1 wavelength of the highest frequency of interest.

Preferably, the bottom substrate top metallization continuous bumps 165A, 165B are configured to provide an environmental seal configured to prevent foreign particles from entering between the top substrate 112 and the bottom substrate 126 after formation of the bond at surface 134, thereby protecting the H-frame device 100.

Preferably, the bottom substrate top metallization discrete bumps 166A-166P are configured to provide one or more of an environmental seal configured to prevent one or more of moisture and foreign particles from entering between the top substrate 112 and the bottom substrate 126 after formation of the bond at the bottom substrate top surface 132, thereby protecting the H-frame device 100.

Figure 1G:
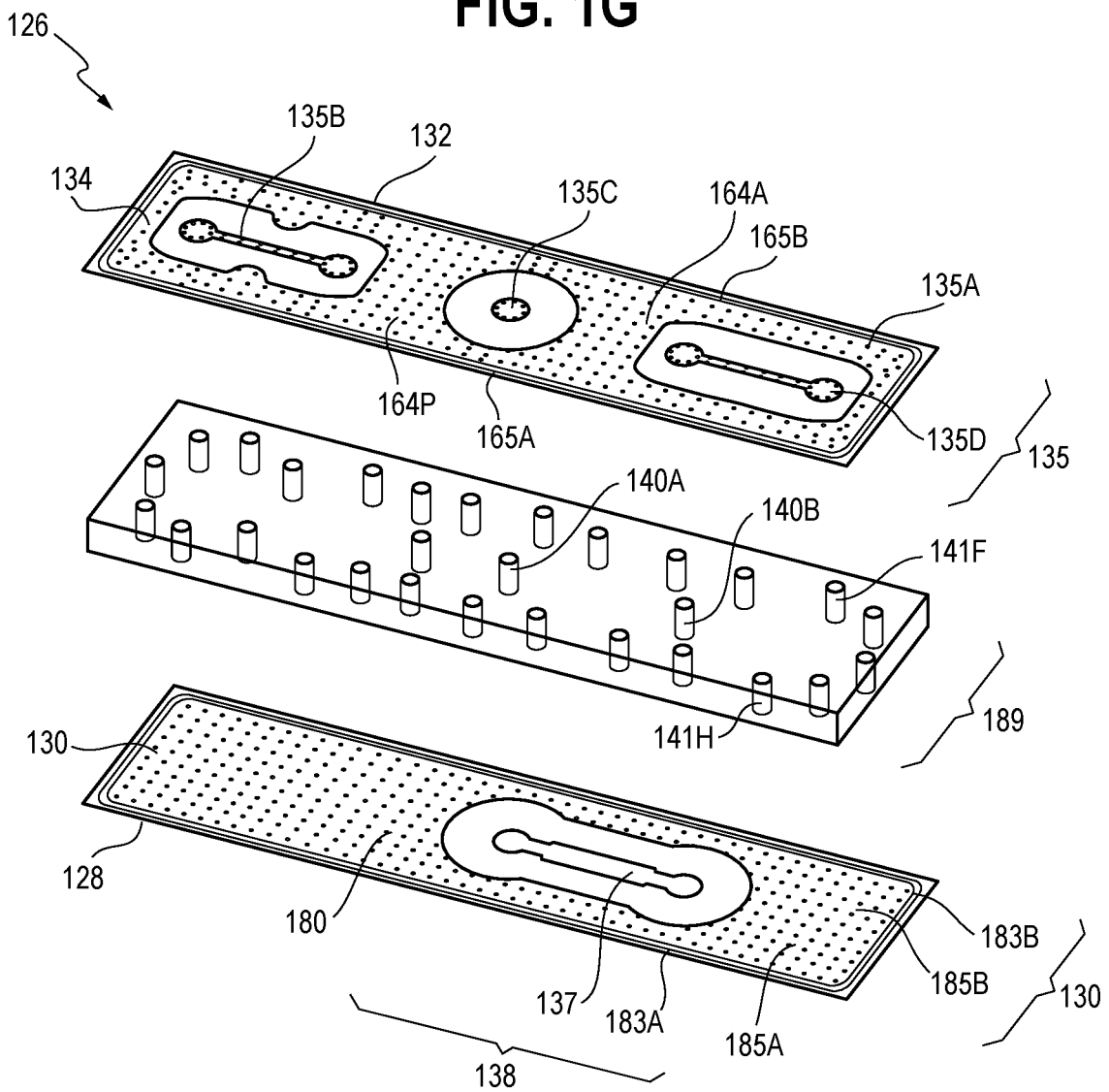
Figure 1H:
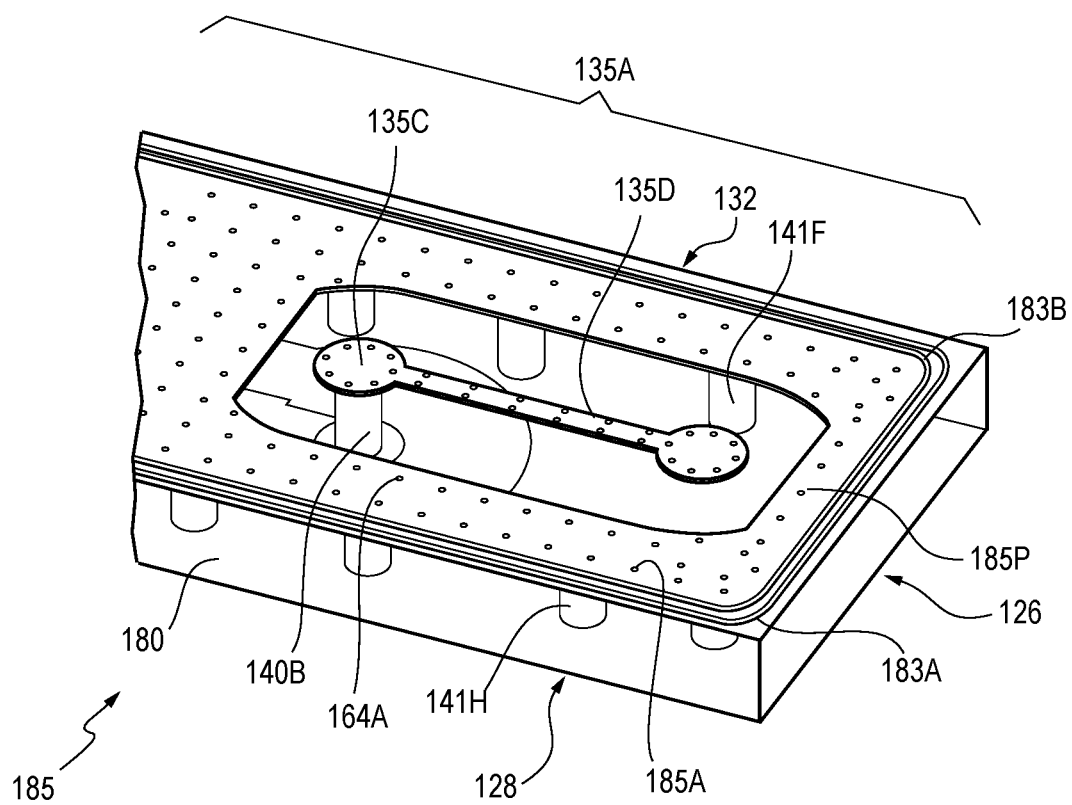

Dotted line 175 in FIG. 1F is the boundary of a detail view of the device provided and discussed in more detail in FIG. 1H.

FIG. 1G shows an exploded view of the bottom substrate 126. The bottom substrate 126 again comprises the bottom substrate bottom metallization 130, the bottom substrate top metallization 135, and the bottom substrate bottom metallization opening 138,. The bottom substrate bottom metallization 130 comprises a bottom substrate bottom signal line 137 configured to conduct a signal.

The bottom substrate 126 further comprises a bottom dielectric 179. The bottom dielectric 179 comprises an electrical insulator. The bottom substrate top metallization 135 again comprises the bottom substrate top metallization continuous bumps 165A-165B and the bottom substrate top metallization discrete bumps 166A-166P.

Also shown again are the bottom substrate bottom surface 128, the bottom substrate top surface 132, the bottom substrate through-substrate vias 140A and 140B, and the bottom substrate ground vias 141F and 141H.

The bottom dielectric 179 comprises the bottom substrate bottom surface 128, the bottom substrate top surface 132, and the bottom substrate through-substrate vias 140A and 140B.

The bottom substrate bottom metallization 130 comprises a bottom substrate bottom ground plane 180 that is grounded. The bottom substrate bottom metallization 130 comprises a bottom substrate bottom signal line 137 configured to conduct a signal.

The bottom substrate bottom metallization 130 further comprises one or more bottom substrate bottom metallization continuous bumps 183A-183B. As depicted, the bottom substrate bottom metallization 130 comprises two concentric bottom substrate bottom metallization continuous bumps 183A, 183B, the bottom substrate bottom metallization concentric continuous bumps 183A, 183B usable for bonding the bottom substrate 126 to the bottom cover 106. Preferably, the bottom substrate bottom metallization concentric continuous bumps 183A, 1836 are spaced so as to be separated by less than approximately 0.1 wavelength of the highest frequency of interest. Preferably, the bottom substrate bottom metallization discrete bumps 185A-185P are spaced so as to be separated by less than approximately 0.1 wavelength of the highest frequency of interest.

Preferably, the bottom substrate bottom metallization continuous bumps 183A, 183B are configured to provide an environmental seal configured to prevent foreign particles from entering the substrate 110 after formation of the bond at the bottom substrate bottom surface 128, thereby protecting the H-frame device 100.

Preferably, the bottom substrate bottom metallization discrete bumps 185A-185P are configured to provide one or more of an environmental seal configured to prevent one or more of moisture and foreign particles from entering the bottom cover 106 after formation of the bond at the bottom substrate bottom surface 128, thereby protecting the H-frame device 100.

FIG. 1H shows a detail view of a portion 175 of FIG. 1F, showing a portion of the bottom substrate 126. Dotted line 175 in FIG. 1F is the boundary of the detail view of the device shown in FIG. 1H.

The bottom substrate 126 again comprises the bottom substrate bottom surface 128, the bottom substrate top surface 132, the bottom substrate top metallization 135A and 135C-135D, the bottom substrate through-substrate vias 140A and 140B, the bottom substrate top metallization concentric continuous bumps 165A-165B, the bottom substrate top metallization discrete bumps 164A-164P, and the bottom substrate bottom ground plane 180. Preferably, the concentric bottom substrate bottom metallization continuous bumps 165A, 165B are spaced so as to be separated by less than approximately 0.1 wavelength of the highest frequency of interest.

The bottom substrate 126 comprises the second bottom substrate through-substrate via 140B, which comprises a second hot bottom substrate through-substrate via 140B usable in a transition. The bottom substrate 126 further comprises the second bottom substrate ground via 141F and the third bottom substrate ground via 141H. The second bottom substrate ground via 141F is configured to provide general grounding of one or more of the bottom substrate 126 and the H-frame device 100. Similarly, the third bottom substrate ground via 141H is configured to provide general grounding of one or more of the bottom substrate 126 and the H-frame device 100.

The bottom substrate bottom metallization 130 further comprises one or more discrete bumps 185A-185P, the discrete bumps 185A-185P usable for bonding the bottom substrate 126 to the bottom cover 106. Preferably, the discrete bumps 185A-185P are spaced so as to be separated by less than approximately 0.1 wavelength of the highest frequency of interest.

Preferably, the bottom substrate bottom metallization continuous bumps 183A, 183B are configured to provide an environmental seal configured to prevent foreign particles from entering bottom cavity (not shown in this figure; item 108 in FIG. 1A) after formation of the bond at the bottom substrate bottom surface 128 to the bottom cover 106, thereby protecting the H-frame device 100.

FIGS. 2A-2G are a set of seven drawings of a circuit using striplines and feedthrough transitions in the microelectronics H-frame device.

Figure 2A:
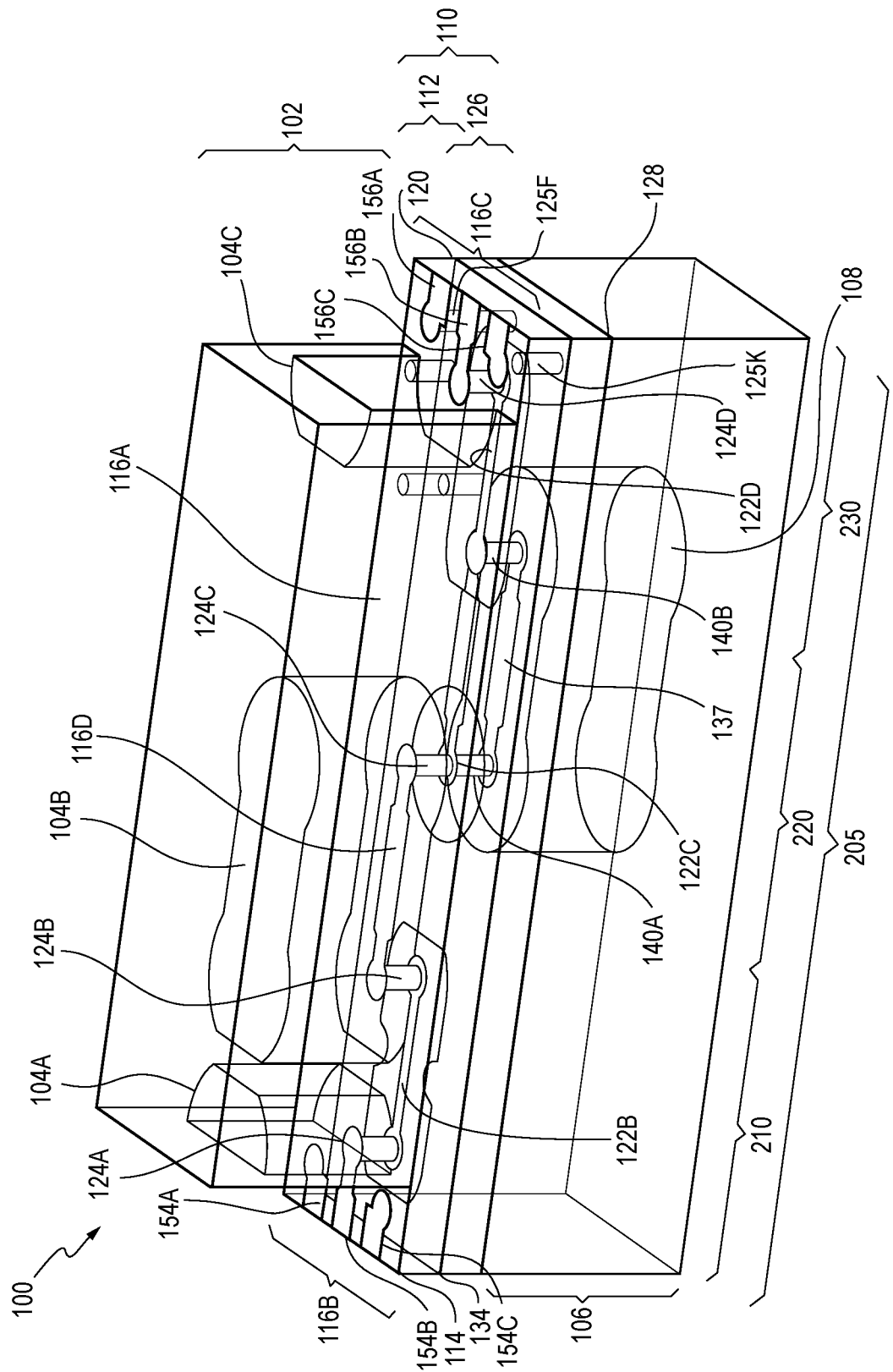
FIGS. 2A-2G are a set of seven drawings of a circuit using striplines and feedthrough transitions in the microelectronics H-Frame device.

FIG. 2A shows a view of the H-frame device 100 and the circuit 205 formed by the H-frame device 100. Shown again are the top cover 102, the bottom cover 106, the substrate 110, the top substrate 112, the first bonding interface 114, the first input/output port 116B, the second input/output port 116C, the first top substrate top signal line 116D, the top substrate bottom surface 120, the first top substrate bottom signal line 122B, the circular top substrate bottom metallization via pad 122C, the second top substrate bottom signal line 122D, the first top substrate through-substrate via 124A, the second top substrate through-substrate via 124B, the third top substrate through-substrate via 124C, the fourth top substrate through-substrate via 124D, the second top substrate ground via 125F, the third top substrate ground via 125K, the fourth top substrate ground via 125M, the bottom substrate 126, the second bonding interface 128, the third bonding interface 134, the bottom substrate bottom signal line 137, the first bottom substrate through-substrate via 140A, the second bottom substrate through-substrate via 140B, the first port first ground metal pad 154A, the first port signal metal pad 154B, the first port second ground metal pad 154C, the second port first ground metal pad 156A, the second port signal metal pad 156B, and the second port second ground metal pad 156C. In this example, a representative thickness of the SiC substrate 110 is approximately 200 microns and a relative dielectric value of the SiC substrate is approximately 9.7.

The circuit 205 comprises a first sub-circuit 210, a second sub-circuit 220, and a third sub-circuit 230. The second sub-circuit 220 is operably connected to the first sub-circuit 210. For example, and preferably, the second sub-circuit 220 is electrically connected to the first sub-circuit 210. The third sub-circuit 230 is operably connected to the second sub-circuit 220. For example, and preferably, the third sub-circuit 230 is electrically connected to the second sub-circuit 220.

The first sub-circuit 210 comprises a first escape transition 210. The first sub-circuit 210 comprises a first escape transition 210 configured to bring a signal between (an outside of one or more of the top cover 102 and the bottom cover 106) and an inside of one or more of the top cover 102 and the bottom cover 106. In this example, the first sub-circuit 210 brings a signal from outside the top cover 102 inside the top cover 102. Accordingly, the first sub-circuit 210 comprises a first microstrip 210. The first microstrip 210 comprises a second signal line 154B running on the top substrate top surface 114. The first microstrip 210 further comprises the top substrate bottom surface 120, which is positioned between the top substrate 112 and the bottom substrate 126.

The first sub-circuit 210 comprises the second signal line 154B, the first top substrate through-substrate via 124A, the first top substrate bottom signal line 122B, the second top substrate through-substrate via 124B, and a portion of the first top substrate top signal line 116D. The second signal line 1546 is operably connected to the first top substrate through-substrate via 124A. Preferably, and as depicted, the second signal line 154B is electrically connected to the first top substrate through-substrate via 124A. The first top substrate through-substrate via 124A is operably connected to the first top substrate bottom signal line 122B. Preferably, and as depicted, the first top substrate through-substrate via 124A is electrically connected to the first top substrate bottom signal line 122B. The first top substrate bottom signal line 122B is operably connected to the second top substrate through-substrate via 124B. Preferably, and as depicted, the first top substrate bottom signal line 1226 is electrically connected to the second top substrate signal via 124B. The second top substrate through-substrate via 124B is operably connected to the first top substrate signal line 116D. Preferably, and as depicted, the second top substrate through-substrate via 124B is electrically connected to the first top substrate top signal line 116D.

The second sub-circuit 220 comprises a vertical feedthrough circuit 220 or second microstrip 220 that feeds the signal from the first sub-circuit 210 to the third sub-circuit 230. The second microstrip 220 comprises the first top substrate top signal line 116D running on the top substrate top surface 114. The second microstrip 220 further comprises the top substrate bottom surface 120, which is positioned between the top substrate 112 and the bottom substrate 126.

The second sub-circuit 220 comprises a portion of the first top substrate signal line 116D, the third top substrate through-substrate via 124C, the circular top substrate bottom metallization via pad 122C, the first bottom substrate through-substrate via 140A, and a portion of the bottom substrate bottom signal line 137. The first top substrate signal line 116D is operably connected to the third top substrate through-substrate via 124C. Preferably, and as depicted, the first top substrate signal line 116D is electrically connected to the third top substrate through-substrate via 124C. The third top substrate through-substrate via 124C is operably connected to the circular top substrate bottom metallization via pad 122C.

Preferably, and as depicted, the third top substrate through-substrate via 124C is electrically connected to the circular top substrate bottom metallization via pad 122C. The circular top substrate bottom metallization via pad 122C is operably connected to the first bottom substrate through-substrate via 140A. Preferably, and as depicted, the circular top substrate bottom metallization via pad 122C is electrically connected to the first bottom substrate through-substrate via 140A. The first bottom substrate through-substrate via 140A is operably connected to the bottom substrate bottom signal line 137. Preferably, and as depicted, the first bottom substrate through-substrate via 140A is electrically connected to the bottom substrate bottom signal line 137.

The third sub-circuit 230 comprises a second escape transition 230. The third sub-circuit 230 comprises a second escape transition 230 configured to do one or more of bring a signal between (the outside of one or more of the top cover 102 and the bottom cover 106) and the inside of one or more of the top cover 102 and the bottom cover 106. In this example, the third sub-circuit 230 brings a signal from inside the bottom cover 106 to outside the bottom cover 106. Accordingly, the third sub-circuit 230 comprises a second microstrip 230. The third microstrip 230 comprises a third signal line 156B running on the top substrate top surface 114. The third microstrip 230 further comprises the top substrate bottom surface 120, which is positioned between the top substrate 112 and the bottom substrate 126.

The third sub-circuit 230 comprises a portion of the bottom substrate bottom signal line 137, the second bottom substrate through-substrate via 140B, the second top substrate bottom signal line 122D, the fourth top substrate through-substrate via 124D, and the second port signal metal pad 156B. The bottom substrate signal line 137 is operably connected to the second bottom substrate through-substrate via 140B. Preferably, and as depicted, the bottom substrate signal line 137 is electrically connected to the second bottom substrate through-substrate via 1406. The second bottom substrate through-substrate via 140B is operably connected to the second top substrate bottom signal line 122D. Preferably, and as depicted, the second bottom substrate through-substrate via 1406 is electrically connected to the second top substrate bottom signal line 122D. The second top substrate bottom signal line 122D is operably connected to the fourth top substrate through-substrate via 124D. Preferably, and as depicted, the second top substrate bottom signal line 122D is electrically connected to the fourth top substrate through-substrate via 124D. The fourth top substrate through-substrate via 124D is operably connected to the second port signal metal pad 156B. Preferably, and as depicted, the fourth top substrate signal via 124D is electrically connected to the second port signal metal pad 156B.

Figure 2B:
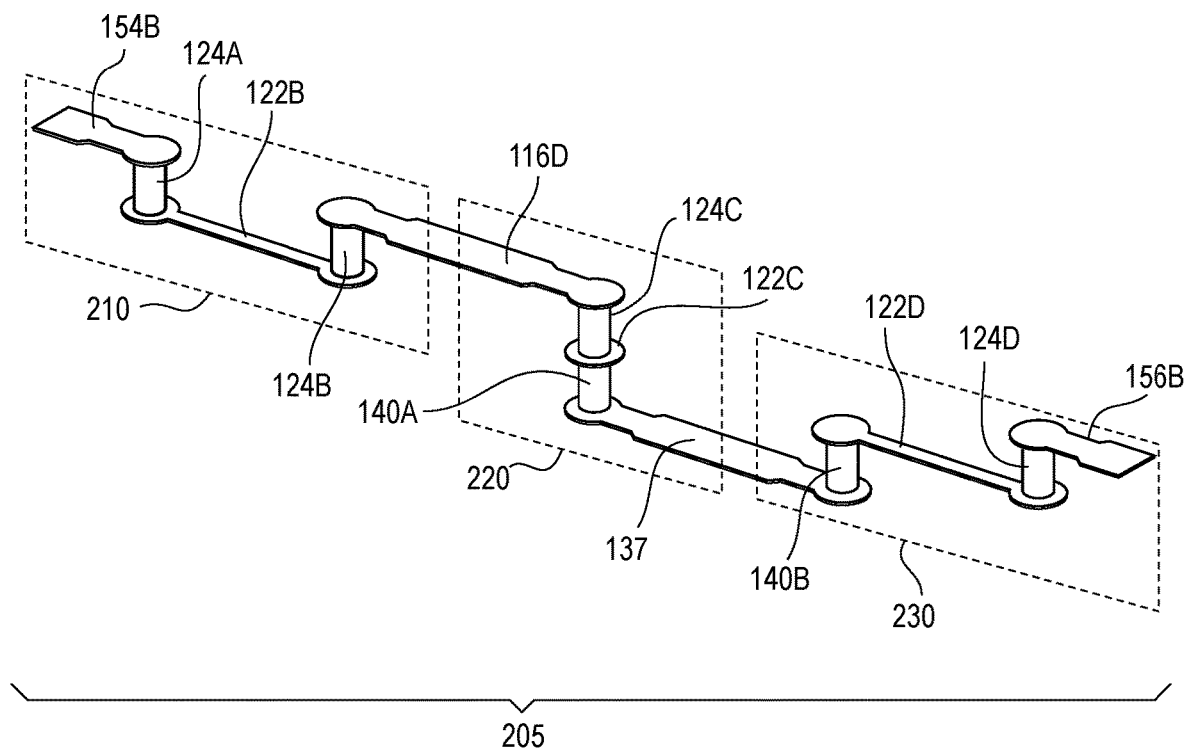

FIG. 2B shows a view of the signal path of the circuit 205. The circuit 205 again comprises the first sub-circuit 210, the second sub-circuit 220, and the third sub-circuit 230. The second sub-circuit 220 is again operably connected to the first sub-circuit 210. For example, and preferably, the second sub-circuit 220 is again electrically connected to the first sub-circuit 210. The third sub-circuit 230 is again operably connected to the second sub-circuit 220. For example, and preferably, the third sub-circuit 230 is again electrically connected to the second sub-circuit 220.

Shown again are the first top substrate top signal line 116D, the first input/output port 154B, the second input/output port 156B, the first top substrate top signal line 116D, the first top substrate bottom signal line 122B, the circular top substrate bottom metallization via pad 122C, the second top substrate bottom signal line 122D, the first top substrate through-substrate via 124A, the second top substrate through-substrate via 124B, the third top substrate through-substrate via 124C, the fourth top substrate through-substrate via 124D, the third top substrate ground via 125H, the fourth top substrate ground via 125K, the first bottom substrate through-substrate via 140A, the second bottom substrate through-substrate via 140B, and the bottom substrate bottom signal line 137.

The first sub-circuit 210 again comprises the second signal line 154B, the first top substrate through-substrate via 124A, the first top substrate bottom signal line 122B, the second top substrate through-substrate via 124B, and a portion of the first top substrate top signal line 116D. The second signal line 154B is again electrically connected to the first top substrate through-substrate via 124A, which is in turn again electrically connected to the first top substrate bottom signal line 122B, which is again electrically connected to the second top substrate through-substrate via 124B, which is again electrically connected to the first top substrate top signal line 116D.

The second sub-circuit 220 comprises a vertical feed-through circuit 220 that feeds the signal from the first sub-circuit 210 to the third sub-circuit 230. The vertical feed-through circuit 220 again comprises a portion of the first top substrate signal line 116D running on the top substrate top surface (item 114 in FIG. 2A; not shown in FIG. 2B). The vertical feed-through circuit 220 again further comprises the third top substrate through-substrate via 124C, the circular top substrate bottom metallization via pad 122C, the first bottom substrate through-substrate via 140A, and a portion of the bottom substrate bottom signal line 137. The first top substrate signal line 116D is again electrically connected to the third top substrate through-substrate via 124C, which is in turn again electrically connected to the circular top substrate bottom metallization via pad 122C, which is again electrically connected to the first bottom substrate through-substrate via 140A, which is again electrically connected to the bottom substrate bottom signal line 137.

The third sub-circuit 230 comprises a second escape transition 230. The third sub-circuit 230 comprises a second escape transition 230 configured to bring a signal between (the outside of one or more of the top cover 102 and the bottom cover 106) and the inside of one or more of the top cover 102 and the bottom cover 106. In this example, the third sub-circuit 230 brings a signal from inside the bottom cover 106 to outside the top cover 102. Accordingly, the third sub-circuit 230 comprises a second microstrip 230. The second microstrip 230 again comprises a portion of the bottom substrate bottom signal line 137, the second bottom substrate through-substrate via 140B, the second top substrate bottom signal line 122D, the fourth top substrate through-substrate via 124D, and the second port signal metal pad 156B. The bottom substrate bottom signal line 137 is again electrically connected to the second bottom substrate bottom through-substrate via 140B, which is in turn again electrically connected to the second top substrate bottom signal line 122D, which is again electrically connected to the fourth top substrate through-substrate via 124D, which is again electrically connected to the second port signal metal pad 156B.

Considered as a whole, the circuit 205 thus comprises, taken in sequence from left to right, the second signal line 154B, the first top substrate through-substrate line 124A, the first top substrate bottom signal line 122B, the second top substrate through-substrate via 124B, the first top substrate top signal line 116D, the third top substrate through-substrate via 124C, the circular top substrate bottom metallization via pad 122C, the first bottom substrate through-substrate via 140A, the bottom substrate bottom signal line 137, the second bottom substrate bottom through-substrate via 140B, the second top substrate bottom signal line 122D, the fourth top substrate through-substrate via 124D, and finally the second port signal metal pad 1566.

In order to optimize the circuit 205, the first sub-circuit 210 may have a different design from the third sub-circuit 230. A representative impedance $Z_0$ of the first sub-circuit 210 is approximately 50 ohms. A representative impedance $Z_0$ of the second sub-circuit 220 is approximately 50 ohms. A representative impedance $Z_0$ of the third sub-circuit 230 is approximately 50 ohms.

Figure 2C:
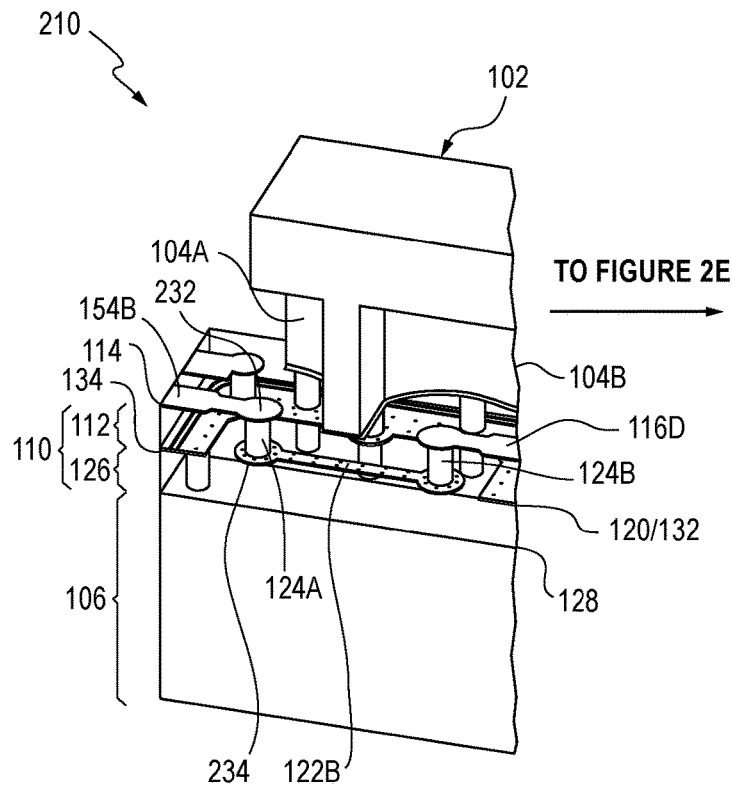

FIG. 2C shows a detail of the first sub-circuit 210, illustrating a vertical feed-through circuit 210 of a signal entering the H-frame device 100. The H-frame device 100 again comprises the top cover 102, the first top cover cavity 104A, the second top cover cavity 1046, the bottom cover 106, and the substrate 110. The substrate 110 again comprises the top substrate 112 and the bottom substrate 126. The top substrate 112 again comprises the top substrate top surface 114 and the top substrate bottom surface 120. The top substrate 112 again further comprises the first top substrate through-substrate via 124A and the second top substrate through-substrate via 124B. The first top substrate through-substrate via 124A operably connects at a top of the first top substrate through-substrate via 124A to a first top substrate via pad 232. Preferably, and as depicted, the first top substrate through-substrate via 124A electrically connects to the first top substrate via pad 232. The first top substrate through-substrate via 124A operably connects at a bottom of the first top substrate through-substrate via 124A to a second top substrate via pad 234.

Figure 2F:
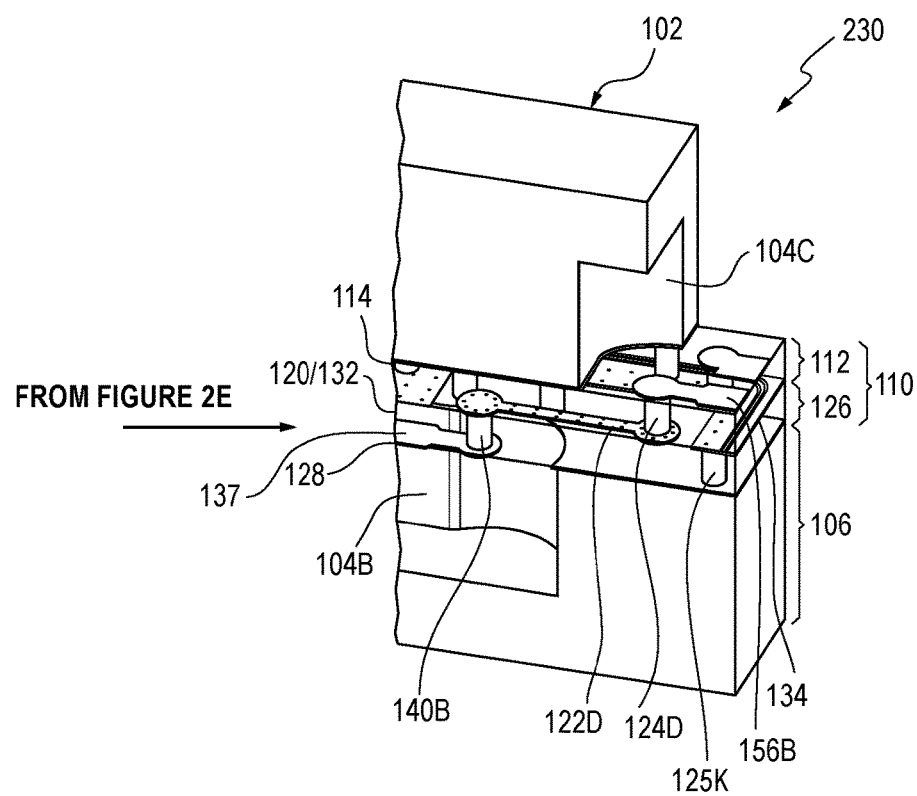
Figure 2D:
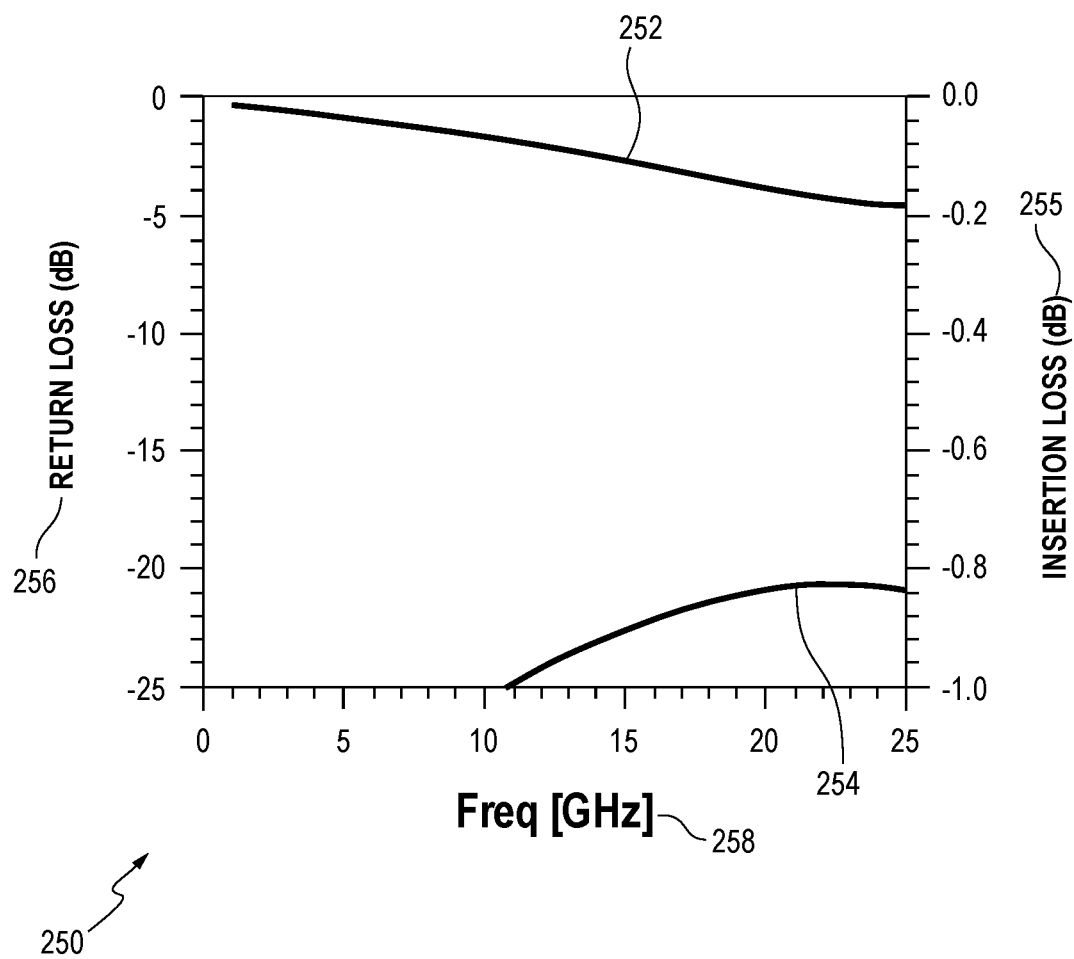
Figure 2E:
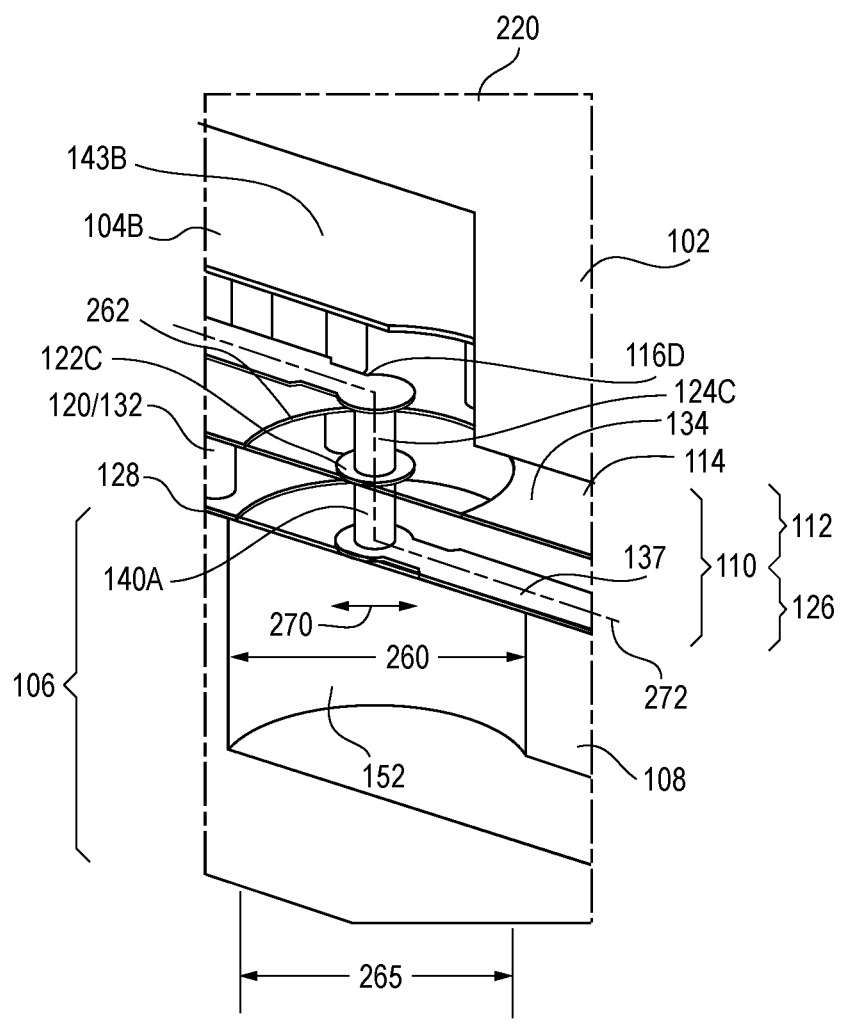

Similar to the via pad 122C-135C as discussed in regard to FIGS. 1D and 2E, with reference to the via pad 122C-135C, the second top substrate via pad 234 comprises a portion of top substrate bottom metallization (not shown in FIG. 2C) and further comprises a portion of bottom substrate top metallization (not shown in FIG. 2C), which are joined together using a plurality of bonding bumps (not shown in FIG. 2C). The top substrate via pad 234 helps to provide one or more of an electrical connection and electrical fencing.

Preferably, and as depicted, the first top substrate through-substrate via 124A electrically connects to the second top substrate via pad 234. The top substrate top surface 114 again comprises the first port signal metal pad 154B and the first top substrate top signal line 116D. The bottom substrate 126 again comprises the bottom substrate top surface 132, which after assembly is joined to the top substrate bottom surface 120 at the third bonding interface 134. The top substrate bottom surface 120 again comprises the first top substrate bottom signal line 122B. The bottom substrate 126 again further comprises the bottom substrate bottom surface 128.

An electronic signal preferably enters the H-frame device 100 from outside via the first port signal metal pad 1546. The electronic signal passes from the first port signal metal pad 154B to the first top substrate via pad 232. The first top substrate through-substrate via 124A electrically connects the first port signal metal pad 1546 to the first top substrate bottom signal line 122B, which comprises the top substrate bottom surface 120, the bottom substrate top surface 132, and the bumps. The first top substrate through-substrate via 124A comprises a one-layer vertical feed-through 124B. The electronic signal then passes from the first top substrate through-substrate via 124A to the top substrate bottom surface signal line 122B, which comprises the top substrate bottom surface 120, the bottom substrate top surface 126, and the bumps. The first top substrate bottom signal line 122B comprises a first stripline 122B, the first stripline 122B configured to travel under the top cover 102 and further configured to travel above the bottom cover 106 in order to enter the second top cover cavity 104B.

In order to minimize reflection at the vertical feed-through circuit 210 over a desired frequency band, dimensions of features in the vertical feed-through circuit 210 can be carefully designed. Dimensions that can be carefully designed to minimize reflection include one or more of a diameter of the first top cavity 104A, a diameter of the second top cavity 104B, a diameter of the first top substrate via pad 232, a diameter of the second top substrate via pad 234, and a diameter of an opening. (An opening is not depicted in this figure but an example of an opening can be seen as a top and bottom metallization opening 262 in FIG. 2E.) Depending on requirements of a particular application, features may be included in the design of the micro-electronics H-frame device such as, for example, as depicted in FIG. 2C, a narrower microstrip section (or, "neck") adjacent to one or more of the first top substrate via pad 232 and the second top substrate via pad 234. Alternatively, or additionally, a narrower section of the microstrip may be adjacent to a wider microstrip section (or, "shoulder"). For example, such a design may facilitate good return loss over a wide frequency band.

For example, a frequency band is selected based on design requirements. For example, for a system intended to operate under direct current up to approximately 20 GHz, SiC substrates may be selected having a thickness between approximately 100 microns and approximately 300 microns. For example, for a system intended to operate under direct current up to approximately 20 GHz, SiC substrates may be selected having via diameters between approximately 50 microns and approximately 150 microns. For example, for the system intended to operate in Q band between approximately 33 GHz and approximately 50 GHz, SiC substrates may be selected having a thickness between approximately 75 microns and approximately 125 microns.

The electronic signal then passes from the first stripline 122B to the second top substrate through-substrate via 124B. The second top substrate through-substrate via 124B comprises a one-layer vertical feed-through 124C. The second top substrate through-substrate via 124B electrically connects the first stripline 122B to the first top substrate top signal line 116D, which is located on the top substrate top surface 114. The signal reaches the first top substrate top signal line 116D and exits the first sub-circuit 210, thereby also exiting the right side of FIG. 2C.

FIG. 2D is a graph 250 of simulation data showing representative values for insertion loss 252 and return loss 254 in a plot of insertion loss decibels (dB) 255 and return loss (dB) 256 against frequency 258 in Gigahertz (GHz) for the first sub-circuit 210.

As shown by the graph 250, the insertion loss 254 is less than approximately 0.2 dB over the entire frequency band 258. As also shown by the graph 250, the return loss 256 exceeds approximately 20 dB over the entire frequency band 258. Generally, representative insertion losses range between approximately 0.01 dB and approximately 0.5 dB, depending on one or more of the material, the type of transition, the size of transition, the frequency, and the design. Generally, representative return losses range between approximately 15 dB and approximately 30 dB depending on the application.

FIG. 2E shows a detail of the second sub-circuit 220, illustrating a vertical feed-through circuit 220 of a signal entering the second sub-circuit 220 of the H-frame device 100. The H-frame device 100 again comprises the top cover 102, the bottom cover 106, and the substrate 110. The top cover 102 again comprises the second top cavity 104B. The second top cavity 104B again comprises the second top cavity wall 143B. The bottom cover 106 again comprises the bottom cavity 108. The bottom cavity 108 again comprises the bottom cavity wall 152. The bottom cavity 108 has a representative bottom cavity diameter 260 equal to approximately 800 microns.

The substrate 110 again comprises the top substrate 112 and the bottom substrate 126. The top substrate 112 again comprises the top substrate top surface 114 and the top substrate bottom surface 120. The top substrate top surface 114 again comprises the first top substrate top signal line 116D. The bottom substrate 126 again comprises the bottom substrate top surface 132, which after assembly is joined to the top substrate bottom surface 120 at the third bonding interface 134. The top substrate bottom surface 120 again comprises the first signal bottom substrate through-substrate via 140A and the bottom substrate bottom signal line 137. The bottom substrate top surface 132 and the top substrate bottom surface 120 comprise a top and bottom metallization opening 262 where the substrate material has been removed, allowing the signal to pass through the bottom substrate top surface 132 and the top substrate bottom surface 120. The top and bottom metallization opening 262 has a representative cutout diameter 265 equal to approximately 600 microns.

The bottom surface again further comprises the bottom substrate bottom surface 128.

An electronic signal preferably enters the second sub-circuit 220 on the top substrate top surface 114 from the first sub-circuit 210 via the first top substrate top signal line 116D. The electronic signal passes from the first top substrate top signal line 116D to the third top substrate through-substrate via 124C before running into the second top cavity wall 143B. The third top substrate through-substrate via 124C electrically connects the first top substrate top signal line 116D to the via pad 122C-135C, discussed above with regard to FIG. 1D.

As mentioned in regard to FIG. 1D, in designing the H-frame device 100, the circular top substrate bottom metallization via pad 122C is approximately matched in shape to the circular bottom substrate top metallization via pad (not shown in FIG. 2E; item 135C shown in FIG. 1A). The circular top substrate bottom metallization via pad 122C is bonded at the third bonding interface 134 to the circular bottom substrate top metallization via pad (not shown in FIG. 2E; item 135C shown in FIG. 1A) using a plurality of bonding bumps (not shown in FIG. 2E). Together, circular top substrate bottom metallization via pad 122C and the circular bottom substrate top metallization via pad (not shown in FIG. 2E; item 135C shown in FIG. 1A) form a via pad 122C-135C, helping to provide one or more of an electrical connection and electrical fencing. The via pad 122C-135C has a representative via pad diameter 270 equal to approximately 200 microns.

The third top substrate through-substrate via 124C is joined to the bottom substrate top surface 132 at the third bonding interface 134. The third top substrate through-substrate via 124C comprises a one-layer vertical feed-through 124E. The electronic signal then passes from the circular top substrate bottom metallization via pad 122C through the top and bottom metallization opening 240 to the first bottom substrate through-substrate via 140A. The first bottom substrate through-substrate via 140A electrically connects the signal to the bottom substrate bottom signal line 137. Once the signal reaches the bottom substrate bottom signal line 137, the signal continues as an inverted microstrip traveling away from the bottom cavity wall 152 and toward the third sub-circuit 230, which is shown in more detail in FIG. 2G.

The second top cavity wall 143B and the bottom cavity wall 152 comprise integral components of the vertical feed-through transition circuit 220. The second top cavity wall 143B and the bottom cavity wall 152 help gradually transform the direction of the electric field in the vertical feed-through transition circuit 220. The second top cavity wall 143B and the bottom cavity wall 152 essentially form a vertical channel connecting the, first top substrate top signal line 116D and the first bottom substrate through-substrate via 140A. The, first top substrate top signal line 116D and the first bottom substrate through-substrate via 140A each become horizontal channels 116D and 137 connected to each other via the one-layer vertical feed-through 124E, the circular top substrate bottom metallization via pad 122C, and the first bottom substrate through-substrate via 140A. These elements together form a Z-shaped three-dimensional channelization 272 that prevents the signal from leaking into areas outside of the channelization 272. The Z-shape of the channelization 272 is an example; other configurations are possible within the scope of embodiments of the invention. The channelization 272 enables the electronic signal to do one or more of change direction and change height. As depicted, the signal, initially horizontal while running through the, first top substrate top signal line 116D, becomes vertical while passing through the one-layer vertical feed-through 124E, the circular top substrate bottom metallization via pad 122C, and the first bottom substrate through-substrate via 140A. The signal then becomes horizontal again while passing through the bottom substrate bottom signal line 137.

The signal therefore exits the second sub-circuit 220 on the right side of FIG. 2E via the bottom substrate bottom signal line 137, which is located on the bottom substrate bottom surface 128. Accordingly, the second sub-circuit 220 has functioned as a vertical feed-through transition 220, receiving a signal on the top substrate top surface 114 via the first top substrate top signal line 116D, and producing an output signal on the bottom substrate bottom surface 128.

FIG. 2F shows a detail of the third sub-circuit 230, illustrating a vertical feed-through circuit 230 of a signal entering the third sub-circuit 230 of the H-frame device 100 and exiting the H-frame device 100. The H-frame device 100 again comprises the top cover 102, the third top cover cavity 104C, the bottom cover 106, and the substrate 110. The substrate 110 again comprises the top substrate 112 and the bottom substrate 126. The top substrate 112 again comprises the top substrate top surface 114 and the top substrate bottom surface 120. The top substrate 112 again further comprises the fourth top substrate through-substrate via 124D and the fourth top substrate ground via 125K. The bottom substrate 126 again further comprises the second bottom substrate through-substrate via 140B. The top substrate top surface 114 again comprises the second port signal metal pad 156B. The bottom substrate 126 again comprises the bottom substrate top surface 132, which after assembly is joined to the top substrate bottom surface 120 at the third bonding interface 134. The top substrate bottom surface 120 again comprises the second top substrate bottom signal line 122D and the bottom substrate bottom signal line 137. The bottom substrate 126 again further comprises the bottom substrate bottom surface 128.

An electronic signal preferably enters the H-frame device 100 from the second sub-circuit 220 via the bottom substrate bottom signal line 137. The electronic signal passes from the bottom substrate bottom signal line 137 to the second bottom substrate through-substrate via 140B. The second bottom substrate through-substrate via 140B electrically connects the bottom substrate bottom signal line 137 to the second top substrate bottom signal line 122D, which is located on the top substrate bottom surface 120. The electronic signal then passes from the second bottom substrate through-substrate via 140B to the second top substrate bottom signal line 122D. The second top substrate bottom signal line 122D comprises a second stripline 122D, the second stripline 122D configured to travel under the top cover 102 and further configured to travel above the bottom cover 106 in order to exit the bottom cavity 108 and reach the third top cavity 104C.

The electronic signal then passes from the second top substrate bottom signal line 122D to the fourth top substrate through-substrate via 124D. The third top substrate through-substrate via 124D comprises a one-layer vertical feed-through 124D.

The fourth top substrate through-substrate via 124D electrically connects the second top substrate bottom signal line 122D to the second port signal metal pad 156B, which is located on the top substrate top surface 114. The signal reaches the second port signal metal pad 156B and exits the right side of FIG. 2F, thereby exiting the third sub-circuit 230 and also thereby exiting the H-frame device 100.

The second bottom substrate through-substrate via 140B and the fourth top substrate through-substrate via 124D together form an offset vertical feed-through transition. While not being vertically aligned, the second bottom substrate through-substrate via 140B and the fourth top substrate through-substrate via 124D together bring the signal line from the bottom substrate bottom signal line 137, which is located on the bottom substrate bottom surface 128, to the second port signal metal pad 156B, which is located on the top substrate top surface 114, subsequently exiting the third sub-circuit 230 and thereby exiting the H-frame device 100.

Figure 2G:
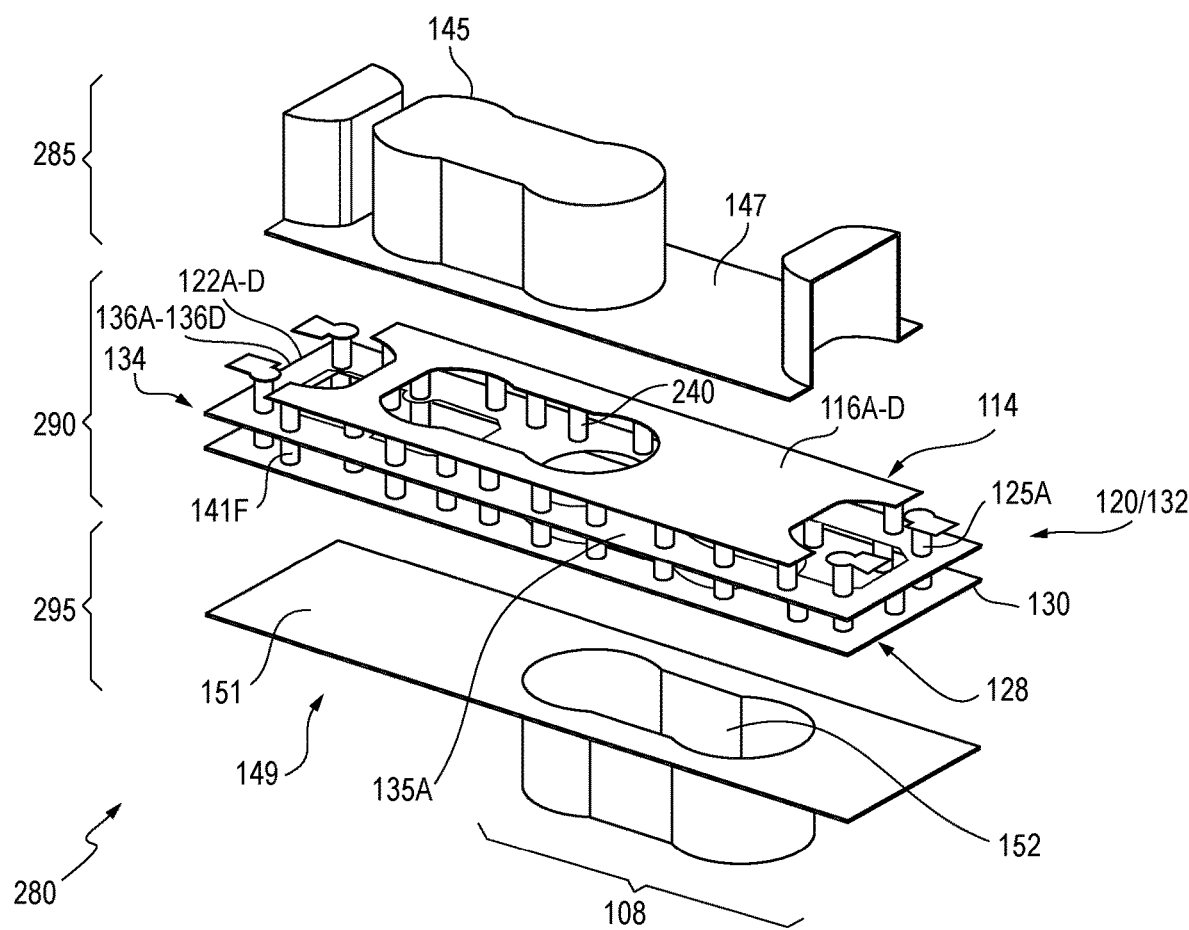

FIG. 2G shows a detail view of a grounding structure 280 for a microelectronics H-frame device. The grounding structure 280 comprises a top cover grounding structure 285, a substrate grounding structure 290, and a bottom cover grounding structure 295. The top cover grounding structure 285 connects to the substrate grounding structure 290 at the top substrate top surface 114. The bottom cover grounding structure 295 connects to the substrate grounding structure 290 at the bottom substrate bottom surface 128.

The top cover grounding structure 285 comprises the top cover metallization 145. The top cover metallization 145 grounds the top cover 102. The top cover metallization 145 thereby provides an integral part of the overall grounding structure of the microelectronics H-frame device 100. For example, the top cover metallization 145 comprises a singly-connected top cover metallization 145. For example, as discussed below in more detail, the top cover metallization 145 is produced by performing gold plating on a micromachined silicon wafer. The top cover metallization 145 comprises the metallized top cover top surface 147. As described below in more detail, during fabrication of the device (item 100 in FIG. 1A), the metallized top cover top surface 147 Is bonded to bumps on the top substrate top surface 114 to complete bonding. The top cover top ground plane 116A connects to the top substrate ground vias 125A-125K, and the top substrate ground vias 125A-125K connect to the top substrate bottom ground plane 122A.

The substrate grounding structure 290 comprises the top cover top metallization 116 comprising the top cover top ground plane 116A, the top substrate bottom metallization 122 comprising the top substrate bottom ground plane 122A, the top substrate ground vias 125A-125K, the bottom substrate bottom metallization 130, the bottom substrate top metallization 135 comprising the bottom substrate top ground plane 135A, and the bottom substrate ground vias 141A-141N. The bottom substrate top surface 132 is bonded to the top substrate bottom surface 120 at the third bonding interface 134. As described below in more detail, the bottom substrate top surface 132 is bonded to the top substrate bottom surface 120 using a plurality of bonding bumps comprised in both the bottom substrate top surface 132 and the top substrate bottom surface 120, forming a thicker metal layer.

Accordingly, the top substrate bottom metallization 122 is electrically connected and in fact physically connected to the bottom substrate top metallization 135. The bottom substrate top ground plane 135A electrically connects to the bottom substrate ground vias 141A-141N.

The bottom cover 106 comprises bottom cover metallization 149. The bottom substrate ground vias 141A-141N electrically connect to the bottom cover metallization 149, completing the grounding structure. The bottom cover metallization 149 grounds the bottom cover 106. The bottom cover metallization 149 comprises the metallized bottom cover top surface 151. The bottom cover metallization 149 thereby provides an integral part of the overall grounding structure of the microelectronics H-frame device (item 100 in FIG. 1A). For example, the bottom cover metallization 149 comprises a singly-connected bottom cover metallization 149. For example, as discussed below in more detail, the bottom cover metallization 149 is produced by performing gold plating on a micromachined silicon wafer. As described below in more detail, during fabrication of the device (item 100 in FIG. 1A), the metallized bottom cover top surface 151 Is bonded to bumps on the bottom substrate top surface 132 to complete bonding. The bottom cover metallization 149 connects to the bottom substrate ground vias 141A-141N, and the top substrate ground vias 125A-125K connect to the top substrate bottom ground plane 122A.

The bottom cover metallization 149 comprises a metallized bottom cavity floor 150. The bottom cover cavity 108 comprises the metallized bottom cavity floor 150. Upon bonding of the bottom cover 106 to the bottom substrate 126, the metallized bottom cavity floor 150 becomes a floor 150 of the bottom cover 106.

The bottom cover metallization 149 further comprises a metallized bottom cavity wall 152. The bottom cover cavity 108 comprises the metallized bottom cavity wall 152.

The grounding structure 280 performs a role in the microelectronics H-frame device 100 equivalent to a metal housing in a traditional electronics module. The grounding structure 280 provides a reference metallization for microwaves travelling through the microelectronics H-frame device 100. The grounding structure 280 forms high-isolation channels for the circuit elements and transmission line. The grounding structure 280 suppresses resonances in the channels and in the grounding area up to a desired frequency. The grounding structure 280 prevents radiation leakage. The grounding structure 280 provides an electromagnetic seal analogous to a Faraday cage. The grounding structure 280 provides one or more of an environmental seal. Preferably, the grounding structure 280 provides an environmental seal.

FIG. 3A-3F are a set of six drawings showing methods for fabrication of the microelectronics H-frame device.

Figure 3A:
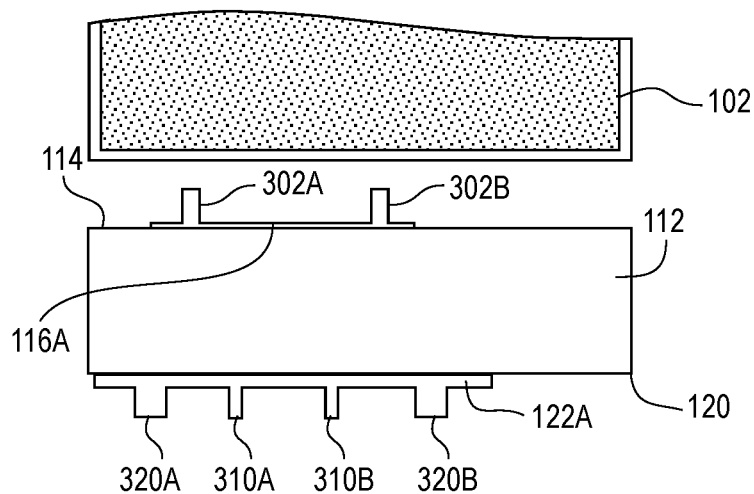
FIGS. 3A-3F are a set of six drawings showing methods for fabrication of the microelectronic H-frame device.
Figure 3B:
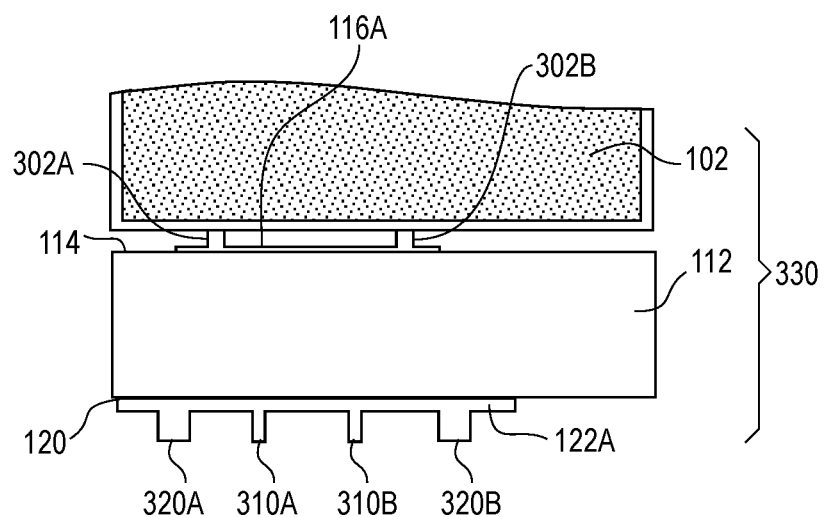

FIGS. 3A-3B depict bonding of the top cover 102 to the top substrate 112.

Figure 3C:
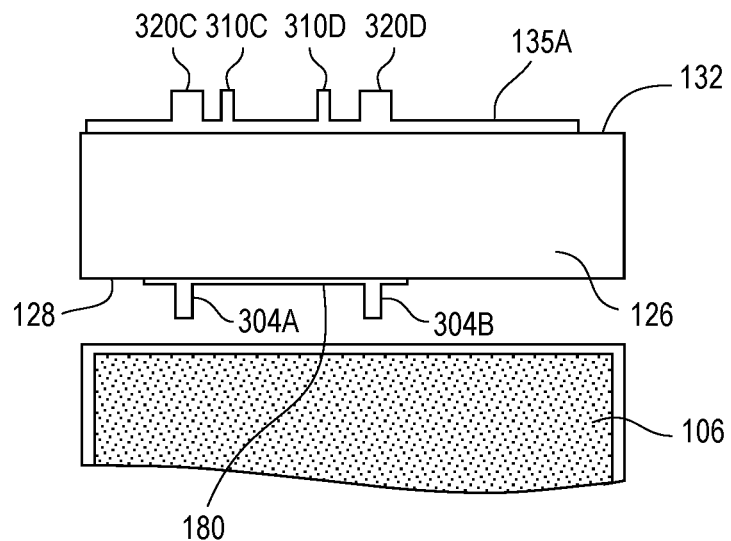
Figure 3D:
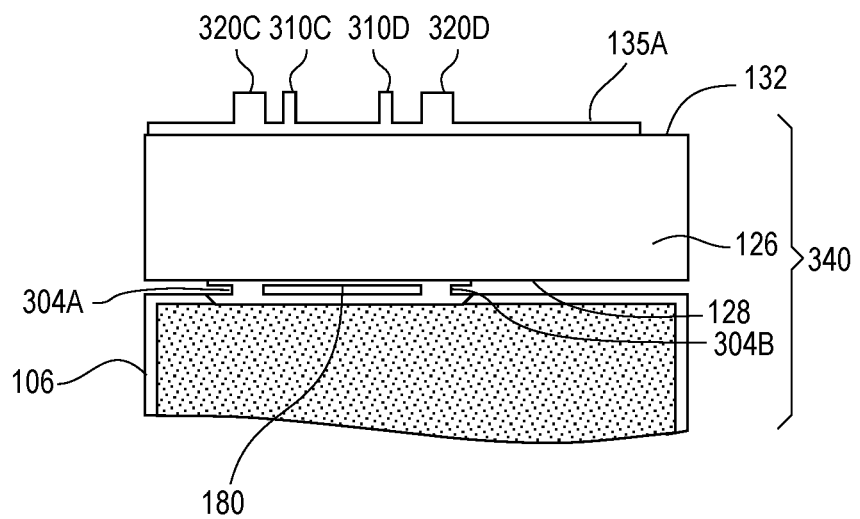

Preferably, although not necessarily, the fabrication of the Microelectronics H-Frame device begins with fabrication of the top substrate 112 and the bottom substrate (not shown in FIGS. 3A-3B; item 126 in FIGS. 3C-3D). Alternatively, fabrication of the device begins with fabrication of the top cover 102 and the bottom cover (not shown in FIGS. 3A-3B; item 106 in FIGS. 3C-3D).

For example, the top substrate 112 is fabricated with a thickness of approximately 200 microns or approximately 8 mils. Preferably, the top substrate 112 comprises silicon carbide (SiC). Preferably, the top substrate 112 further comprises high precision metallization features, preferably comprised of gold. For example, the metallization on the top substrate 112 comprises one or more of high-precision plated gold and evaporated gold.

In FIG. 3A, we see the top cover 102 and the top substrate 112 immediately prior to their bonding to each other.

In the Microelectronics H-Frame device fabrication process, the top cover 102 and the bottom cover (not shown in FIGS. 3A-3B; item 106 in FIGS. 3C-3D) are fabricated. For example, one or more of the top cover 102 and the bottom cover (not shown in FIGS. 3A-3B; item 106 in FIGS. 3C-3D) are fabricated using deep reactive-ion etching (DRIE). For example, one or more of the top cavities (not shown in this figure; items 104A-104C in FIG. 1A) is fabricated with a depth of approximately 0.635 millimeters (mm) or approximately 25 mils. For example, the bottom cavity (not shown in this figure; item 108 in FIG. 1A) is fabricated with a depth of approximately 0.635 millimeters (mm) or approximately 25 mils.

The top substrate 112 again comprises the top substrate top surface 114. The top substrate 112 again further comprises the top substrate bottom surface 120.

The top substrate 112 further comprises a plurality of top substrate-cover bonding bumps 302A and 302B on the top substrate top ground plane 116A. The top substrate-cover bonding bumps 302A and 302B each comprise one or more of the top substrate top metallization continuous bump 158A-158B and the top substrate top metallization discrete bumps 160A-160P. Preferably, and as depicted, the top substrate top surface 114 comprises the plurality of top substrate-cover bonding bumps 302A and 302B. Preferably, the top substrate-cover bonding bumps 302A and 302B are formed by plating the top substrate top surface 114 to a thickness of approximately 5 microns. The top substrate-cover bonding bumps 302A and 302B are usable in bonding the top substrate 112 to the top cover 102. The top substrate-cover bonding bumps 302A and 302B are configured to be crushed during bonding and to thereby compensate for minor non-planarities in the top substrate top surface 114, thereby facilitating strong gold-gold thermocompression. For example, a non-planarity may be in the range of approximately 1 micron to approximately 3 microns for a wafer having a diameter of approximately 100 mm. The plating of the bonding bumps can be done concurrently with the plating of the metallization of the signal channel if both have the same thickness. Otherwise, the plating of the of the bonding bumps is done in a separate photolithography and plating step.

For example, bonding bumps have a diameter of approximately 15 microns. For example, bonding bumps have a bump height of approximately 5 microns. For example, bumps are spaced by a distance of approximately 200 microns. A maximum bump spacing is approximately a quarter wavelength. Preferably, the bump spacing is approximately a tenth of a wavelength.

The top substrate 112 further comprises a plurality of top substrate-substrate bonding bumps 310A and 310B on the bottom ground plane 122A of the top substrate 112, the top substrate-substrate bonding bumps 310A and 310B configured to facilitate bonding of the top substrate 112 to the bottom substrate (item 126 in FIGS. 3C-3D; not shown in FIG. 3A). The bonding of the top substrate 112 to the bottom substrate (item 126 in FIGS. 3C-3D; not shown in FIG. 3A) creates a third vertical electrical connection between the top substrate 112 and the bottom substrate 126.

A shape in the bottom substrate top metallization 135 connects the second vertical electrical connection at an inner side of the bottom cover 106 to the third vertical electrical connection at an outer side of the top cover 102. Using the third vertical connection, the bottom substrate top metallization 135 is electrically connected to the top substrate bottom metallization 122 at an outer side of the top cover 102. Using the first vertical connection, the top substrate top metallization 116 is electrically connected to the top substrate bottom metallization 122. For example, using the first vertical electrical connection, the top substrate top metallization 116 is electrically connected to the top substrate bottom metallization 122 at the outer side of the top cover 102. As above, using the third vertical connection, the top substrate bottom metallization 122 is electrically connected to the bottom substrate top metallization 135, and using the second vertical connection, the bottom substrate top metallization 135 is electrically connected to the bottom substrate bottom metalization 130.

For example, the bonding of the top substrate 112 to the bottom substrate 126 forms one or more signal metallizations, each of which comprises an interconnection of two or more of: a signal top substrate top metallization, a signal through-substrate via comprised in the top substrate, a signal top substrate bottom metallization, a signal bottom substrate top metallization, a signal through-substrate vias comprised in the bottom substrate, and a signal bottom substrate bottom metallization.

Preferably, and as depicted, the top substrate bottom surface 120 further comprises a first top substrate-substrate bonding bump 310A and a second top substrate-substrate bonding bump 310B. Preferably, the top substrate-substrate bonding bumps 310A and 310B are formed by plating the top substrate bottom surface 120 to a thickness of approximately 5 microns.

As shown in more detail below in FIGS. 3C-3D, the bottom substrate (item 126 in FIGS. 3C-3D; not shown in FIG. 3A) further comprises a plurality of bottom substrate-substrate bonding bumps (items 310C and 310D in FIGS. 3C-3D; not shown in FIG. 3A).

As shown in more detail below in FIGS. 3E and 3F, the bottom substrate-substrate bonding bumps (items 310C and 310D in FIGS. 3C-3D; not shown in FIG. 3A) are configured to mate with the top substrate-substrate bonding bumps 310A and 310B during bonding.

The top substrate bottom surface 120 further comprises a plurality of top standoff bumps 320A and 320B that are fabricated on top of the top substrate bottom ground plane 122A that decrease the effective pressure on all bumps on the top substrate bottom surface 320A, 310A, 310B, and 320B, so that these bumps do not deform during the bonding of 112 and 102. Preferably, and as depicted, the top substrate bottom surface 120 further comprises a first top standoff bump 320A and a second top standoff bump 320B. Preferably, although not necessarily, and as depicted, the first top standoff bump 320A is broader than both of the top substrate-substrate bonding bumps 310A and 310B. Preferably, although not necessarily, and as depicted, the second top standoff bump 320B is broader than both of the top substrate-substrate bonding bumps 310A and 310B.

Preferably, although not necessarily, and as depicted, the first top standoff bump 320A is bigger than both of the top substrate-substrate bonding bumps 310A and 310B. Preferably, although not necessarily, and as depicted, the second top standoff bump 320B is bigger than the top substrate-substrate bonding bumps 310A and 310B. Accordingly, the top standoff bumps 320A and 320B do not bond to each other.

Preferably, the top standoff bumps 320A and 320B are formed by plating the top substrate bottom surface 120 to a thickness of approximately 5 microns. As shown in more detail in FIGS. 3E and 3F, the top standoff bumps 320A and 320B are configured to prevent crushing of one or more of the top substrate-substrate bonding bumps 310A and 310B during bonding of top cover to top substrate. The first top standoff bump 320A is offset from both of the bottom standoff bumps 320C-320D. Similarly, the second top standoff bump 320B is also offset from both of the bottom standoff bumps 320C-320D.

In summary, the top standoff bumps 320A and 320B are spaced from all other bumps 302A, 302B, 304A, 304B, 310A-310D, 320C, and 320D so as to allow bonding between the top substrate-substrate bonding bumps 310A-310B and the bottom substrate-substrate bonding bumps 310C-310D, and wherein the bottom standoff bumps 320C and 320D are spaced from all other bumps 302A, 302B, 304A, 304B, 310A-310D, 320A, and 320B so as to avoid affecting bonding between the top substrate-substrate bonding bumps 310A-310B and the bottom substrate-substrate bonding bumps 310C-310D.

Accordingly, the top standoff bumps 320A and 320B do not bond to the top substrate-substrate bonding bumps 310A and 310B.

FIG. 3B depicts the top cover 102 after bonding to the top substrate 112 using the top substrate-cover bonding bumps 302A and 302B on the top substrate top ground plane 116A, creating a top assembly 330. The top substrate 112 again comprises the top substrate top surface 114. The top substrate 112 again further comprises the top substrate bottom surface 120. The top substrate 112 again further comprises the plurality of top substrate-substrate bonding bumps 310A and 310B on the top substrate bottom ground plane 122A, the top substrate-substrate bonding bumps 310A and 310B configured to facilitate bonding of the top substrate 112 to the bottom substrate (item 126 in FIGS. 3C-3D; not shown in FIG. 3B). The bonding of the top substrate 112 to the bottom substrate (item 126 in FIGS. 3C-3D; not shown in FIG. 3A) creates a vertical electrical connection between the top substrate 112 and the bottom substrate 126. The top substrate 112 again further comprises the plurality of top standoff bumps 320A and 320B on the top substrate bottom ground plane 122A.

A reduction in size of the top substrate-cover bumps 302A and 302B after crushing is depicted. For this phase, an exemplary pressure is approximately 600 megapascals (MPa).

The top cover 102 is bonded to the top substrate 112. For example, the top cover 102 and the top substrate 112 are bonded together using a high accuracy chip bonder. For example, the top cover 102 and the top substrate 112 are bonded together to form robust gold-gold thermocompression bonds.

FIGS. 3C-3D depicts bonding of the bottom cover 106 to the bottom substrate 126. For example, the bottom substrate 126 is fabricated with a thickness of approximately 200 microns or approximately 8 mils. Preferably, the bottom substrate 126 comprises silicon carbide (SiC). Preferably, the bottom substrate 126 further comprises high precision metallization features. Preferably, the bottom substrate 126 further comprises gold. For example, the bottom substrate 126 comprises one or more of high-precision plated gold and evaporated gold.

In FIG. 3C, we see the bottom cover 106 and the bottom substrate 126 prior to their bonding to each other.

The bottom substrate 126 again comprises the bottom substrate bottom surface 128 and the bottom substrate top surface 132.

The bottom substrate 126 further comprises a plurality of bottom substrate-cover bonding bumps 304A and 304B on the bottom substrate bottom ground plane 180. The top substrate-cover bonding bumps 302A and 302B each comprise one or more of the bottom substrate bottom metallization continuous bump 183A-183B and the bottom substrate bottom metallization discrete bumps 185A-185P. Preferably, and as depicted, the bottom substrate bottom surface 128 comprises the plurality of bottom substrate-cover bonding bumps 304A and 304B. Preferably, the bottom substrate-cover bonding bumps 304A and 304B are formed by plating the bottom substrate bottom surface 128 to a thickness of approximately 5 microns. The bottom substrate-cover bonding bumps 304A and 304B are usable in bonding the bottom substrate 110 to the bottom cover 106. The bottom substrate-cover bonding bumps 304A and 304B are configured to be crushed during bonding and to thereby compensate for minor non-planarities in the bottom substrate bottom surface 128, thereby facilitating strong gold-gold thermocompression. For example, a non-planarity may be in the range of approximately 1 micron to approximately 3 microns.

The bottom substrate 126 further comprises a plurality of bottom substrate-substrate bonding bumps 310C and 310D on the bottom substrate top ground plane 135A, the bottom substrate-substrate bonding bumps 310C and 310D configured to facilitate bonding of the bottom substrate 126 to the top substrate (item 112 in FIGS. 3A-3B; not shown in FIG. 3C). Preferably, and as depicted, the bottom substrate top surface 132 further comprises a first bottom substrate-substrate bonding bump 310C and a second bottom substrate-substrate bonding bump 310D. Preferably, the bottom substrate-substrate bonding bumps 310C and 310D are formed by plating the bottom substrate top surface 132 to a thickness of approximately 5 microns.

As shown in more detail below in FIGS. 3E and 3F, the bottom substrate-substrate bonding bumps 310C and 310D are configured to mate with the top substrate-substrate bonding bumps (items 310A and 310B in FIGS. 3A-3B; not shown in FIG. 3C) during bonding.

The bottom substrate 126 further comprises a plurality of bottom standoff bumps 320C and 320D on the bottom substrate top ground plane 135A. Preferably, although not necessarily, and as depicted, the bottom standoff bumps 320C and 320D are broader than the substrate-substrate bonding bumps 310C and 310D. Preferably, although not necessarily, and as depicted, the bottom standoff bumps 320C and 320D are bigger than the substrate-substrate bonding bumps 310C and 310D. Preferably, although not necessarily, and as depicted, the bottom standoff bumps 320C and 320D are broader than the substrate-substrate bonding bumps 310C and 310D. Preferably, although not necessarily, and as depicted, the bottom standoff bumps 320C and 320D are bigger than the substrate-substrate bonding bumps 310C and 310D. Accordingly, the bottom standoff bumps 320C and 320D do not bond to each other.

The bottom standoff bumps 320C and 320D are configured to prevent crushing of one or more of the bottom substrate-substrate bonding bumps 310C and 310D during bonding of bottom cover 106 to bottom substrate 126. Preferably, although not necessarily, and as depicted, the bottom standoff bumps 320C and 320D are bigger than the bottom substrate-substrate bonding bumps 310C and 310D. Preferably, although not necessarily, and as depicted, the bottom standoff bumps 320C and 320D are broader than the bottom substrate-substrate bonding bumps 310C and 310D. Accordingly, the bottom standoff bumps 320C and 320D do not bond to the bottom substrate-substrate bonding bumps 310C and 310D.

FIG. 3D depicts the bottom cover 106 after bonding to the bottom substrate 126 using the bottom substrate-cover bumps 304A and 304B on the bottom substrate bottom ground plane 180, creating a bottom assembly 340. The bottom substrate 126 again comprises the bottom substrate bottom surface 128 and the bottom substrate top surface 132. The bottom substrate 126 again further comprises the plurality of bottom substrate-substrate bonding bumps 310C and 310D on the bottom substrate top ground plane 135A, the bottom substrate-substrate bonding bumps 310C and 310D configured to facilitate bonding of the bottom substrate 126 to the top substrate (item 112 in FIGS. 3A-3B; not shown in FIG. 3D). The bottom substrate 126 again further comprises the plurality of bottom standoff bumps 320C and 320D on the bottom substrate top ground plane 135A.

A reduction in size of the bottom substrate-cover bumps 304A and 304B after crushing is depicted. For this phase, an exemplary pressure is approximately 600 megapascals (MPa).

Preferably, the bottom standoff bumps 320C and 320D are formed by plating the bottom substrate top surface 132 to a thickness of approximately 5 microns. As shown in more detail in FIGS. 3E and 3F, the bottom standoff bumps 320C and 320D are configured to prevent crushing of one or more of the bottom substrate-substrate bonding bumps 310C and 310D during bonding of the bottom cover 106 to the bottom substrate 126. The first bottom standoff bump 320C is offset from both of the top substrate-substrate bonding bumps (items 310A-310B in FIGS. 3A-3B; not shown in FIG. 3C). Similarly, the second bottom standoff bump 320D is also offset from both of the top substrate-substrate bonding bumps (items 310A-310B in FIGS. 3A-3B; not shown in FIG. 3C).

The first bottom standoff bump 320C is also offset from both of the top standoff bumps (items 320A-320B in FIGS. 3A-3B; not shown in FIG. 3C). Similarly, the second bottom standoff bump 320D is also offset from both of the top standoff bumps (items 320A-320B in FIGS. 3A-3B; not shown in FIG. 3C). Therefore, during bonding of bottom cover 106 to bottom substrate 126, all pressure from bonding distributed between the bottom standoff bumps 320C and 320D and bottom bonding bumps 310C and 310D, preventing the bottom substrate-substrate bonding bumps 310C and 310D from being deformed.

Figure 3E:
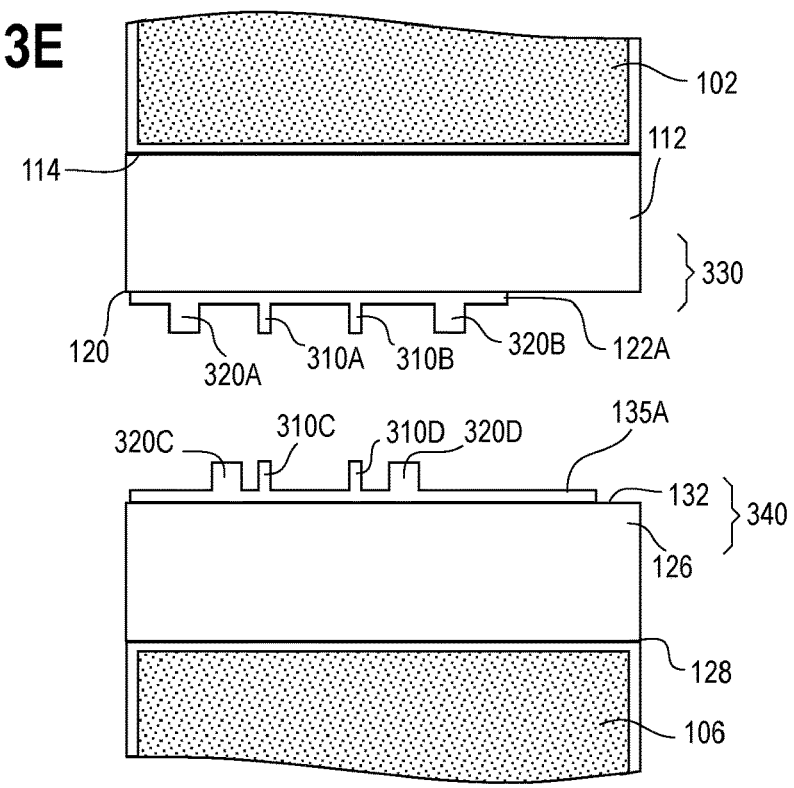
Figure 3F:
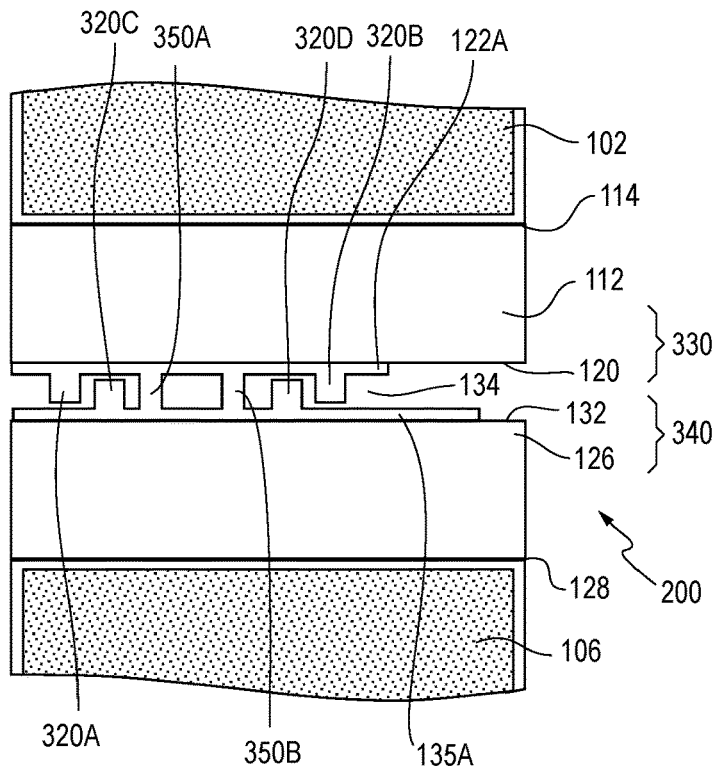

FIGS. 3E-3F depict bonding of the top substrate 112 to the bottom substrate 126. The bonding of the top substrate 112 to the bottom substrate (item 126 in FIGS. 3C-3D; not shown in FIG. 3A) creates a vertical electrical connection between the top substrate 112 and the bottom substrate 126. The top substrate 112 again comprises the top substrate top surface 114 and the top substrate bottom surface 120. The bottom substrate 126 again comprises the bottom substrate bottom surface 128 and the bottom substrate top surface 132.

The bottom substrate-substrate bonding bumps 310C and 310D on the bottom substrate top ground plane 135A in FIGS. 3C-3D are configured align and to mate with the top substrate-substrate bonding bumps 310A and 310B on the top substrate bottom ground plane 122A during bonding. For example, and as depicted, the top substrate-substrate bonding bumps 310C is configured to mate with the top substrate-substrate bonding bump 310A during bonding. For example, and as depicted, the top substrate-substrate bonding bumps 310D is configured to mate with the top substrate-substrate bonding bump 310B during bonding.

The top standoff bumps 320A and 320B on the top substrate bottom ground plane 122A are configured to prevent crushing of one or more of the top substrate-substrate bonding bumps 310A and 310B during bonding of the top cover 102 to the top substrate 112.

The bonding of the top cover 102 to the top substrate 112 creates a vertical electrical connection between the top substrate top metallization 116 and the top cover metallization 145. Similarly, the bonding of the bottom cover 106 to the bottom substrate 126 creates a vertical electrical connection between the bottom substrate top metallization 135 and the bottom cover metallization 149.

The bonding of the top cover 102, the top substrate 112, the bottom substrate 126, and the bottom cover 106 forms a reference metallization, the reference metallization comprising one or more of: a) the top cover metallization 145; b) a reference top substrate top metallization, c) reference top substrate through-substrate vias comprised in the top substrate, d) a reference top substrate bottom metallization, e) a reference bottom substrate top metallization, f) reference bottom substrate through-substrate vias comprised in the bottom substrate, g) a reference bottom substrate bottom metallization, and h) the bottom cover metallization 149.

The bottom standoff bumps 320C and 320D on the bottom substrate top ground plane 135A are configured to prevent crushing one or more of the bottom substrate-substrate bonding bumps 310C and 310D during bonding of the bottom cover 106 to the bottom substrate 126. The first top standoff bump 320A is offset from both of the bottom substrate-substrate bonding bumps 310C-310D. Similarly, the second top standoff bump 320B is also offset from both of the bottom substrate-substrate bonding bumps 310C-310D.

The bottom standoff bump 320C is offset from both of the top substrate-substrate bonding bumps 310A-310B. Similarly, the bottom standoff bump 320D is also offset from both of the top substrate-substrate bonding bumps 310A-310B.

Therefore, during bonding of top assembly to bottom assembly, all pressure from bonding is on the top substrate-substrate bonding bumps 310A, 310B and the bottom substrate-substrate bonding bumps 310C and 310D, In FIG. 3E, we see the top assembly 330 and the bottom assembly 340 immediately prior to their bonding to each other. The top assembly 330 again comprises the top cover 102 and the top substrate 112. The bottom assembly 340 again comprises the bottom cover 106 and the bottom substrate 126.

The top assembly 330 again comprises the top cover 102 and the top substrate 112. The top substrate 112 again comprises the top substrate top surface 114 and the top substrate bottom surface 120. The bottom substrate 126 again comprises the bottom substrate bottom surface 128 and the bottom substrate top surface 132.

The top substrate bottom surface 120 again comprises the top standoff bumps 320A and 320B. The bottom substrate top surface 132 again comprises the bottom substrate-substrate bonding bumps 310C and 310D on the bottom substrate top ground plane 135A. The bottom substrate 132 again further comprises the bottom standoff bumps 320A and 320B on the top substrate bottom ground plane 122A. The top substrate-substrate bonding bump (item 310A in FIG. 3E; not shown in FIG. 3F) combines with the bottom substrate-substrate bonding bump (item 310C in FIG. 3E; not shown in FIG. 3F) to form a first combined bonding bump 350A configured to help bond the top substrate 112 to the bottom substrate 126. Similarly, the top substrate-substrate bonding bump (item 310B in FIG. 3E; not shown in FIG. 3F) combines with the bottom substrate-substrate bonding bump (item 310D in FIG. 3E; not shown in FIG. 3F) to form a second combined bonding bump 350B configured to help bond the top substrate 112 to the bottom substrate 126.

The top substrate top ground plane (item 116A in FIGS. 3A-3B) and the top substrate bottom ground plane (item 122A in FIGS. 3A-3B) are no longer visible after the fabrication steps are completed that are illustrated in FIGS. 3A-3D and accordingly the top substrate top ground plane (item 116A in FIGS. 3A-3B) and the top substrate bottom ground plane (item 122A in FIGS. 3A-3B) are not depicted in FIGS. 3E-3F. Similarly, the bottom substrate bottom ground plane (item 180 in FIGS. 3C-3D) and the bottom substrate top ground plane (item 135A in FIGS. 3C-3D) are no longer visible after the fabrication steps are completed that are illustrated in FIGS. 3A-3D and accordingly the bottom substrate bottom ground plane (item 180 in FIGS. 3C-3D) and the bottom substrate top ground plane (item 135A in FIGS. 3C-3D) are not depicted in FIGS. 3E-3F.

FIG. 3F depicts a moment immediately after bonding the top assembly 330 and the bottom assembly 340 together, thereby creating the finished H-frame device 100.

In FIG. 3F, after bonding and crushing of the top substrate-substrate bonding bumps (items 310A and 310B in FIGS. 3A-3B and 3E) and of the bottom substrate-substrate bonding bumps (items 310C and 310D in FIGS. 3C-3E), the top substrate-substrate bonding bumps (items 310A and 310B in FIGS. 3A-3B and 3E) and the bottom substrate-substrate bonding bumps (items 310C and 310D in FIGS. 3C-3E) have combined into a single bonded bump.

FIG. 4 is a flow chart of a method 400 for fabricating a micro-electronics H-frame device.

The order of the steps in the method 400 is not constrained to that shown in FIG. 4 or described in the following discussion. Several of the steps could occur in a different order without affecting the final result.

In step 410, a top cover usable in a micro-electronics H-frame device is micro-machined. Block 410 then transfers control to block 420.

In step 420, a bottom cover usable in the micro-electronics H-frame device is micro-machined. Block 420 then transfers control to block 430.

In step 430, a top surface of a top substrate usable in the micro-electronics H-frame device and a bottom surface of a bottom substrate usable in the micro-electronics H-frame device are fabricated together on a front of a wafer, wherein the top surface of the top substrate comprises top substrate top metallization, and wherein the bottom surface of the bottom substrate comprises bottom surface bottom metallization. For example, the top substrate is pattern-plated and via-etched. For example, the bottom substrate is pattern-plated and via-etched. Block 430 then transfers control to block 435.

In step 435, mid-substrate metallization is fabricated. Block 435 then transfers control to block 440.

In step 440, the top substrate is bonded to the top cover. Block 440 then transfers control to block 450.

In step 450, the bottom substrate is bonded to the bottom cover. Block 450 then transfers control to block 460.

In step 460, the top substrate is bonded to a top surface of the mid-substrate metallization and the bottom substrate is bonded to a bottom surface of the mid-substrate metallization, thereby creating a vertical electrical connection between the top substrate and the bottom substrate. Block 460 then terminates the process.

The fabrication process used for the H-frame SiC core chips and Silicon subcover chips is a key to important additional functionality.

The fabrication process and inventive concept allow a wide range of functionality through the use of geometries in the silicon subcover such as alcoves, walls, islands, peninsulas, and closed-off chambers.

The superior degree of dimensional accuracy, and the surface smoothness of the interior recesses and surfaces interior of the enclosures achieved by the micromachining are advantages of the invention. Additional advantages include the ability to manufacture devices that have highly repeatable characteristics and performance and that have low electrical loss. Prior art enclosures made by traditional mechanical manufacturing techniques such as machining, electro-discharge machining (EDM), electroform, etc., have a tolerance in the range of 0.2 mils to 1 mil, which is one to two orders of magnitude larger than the precision provided by the semiconductor technology described herein.

For example, the micromachined interior surfaces in the exemplary enclosures have a peak to valley roughness of less than 2 µm, i.e. 1.3 µm, as compared to a prior art machined copper housing with a peak to valley roughness of about 9.4 µm. Accordingly, embodiments of the invention provide a more than 7 times improvement in smoothness.

Although a conductive epoxy paste can be utilized to achieve assembly of the silicon and SiC, the conductive paste provides a more difficult technique to control in terms of ooze-out, thickness variation, air voids and poor electrical contact, etc., as well as placement accuracy.

With respect to the vias, 100-micron diameter metallized through-substrate vias connecting ground metallization on opposing surfaces on the substrate are used to form high-isolation electromagnetic via fences. Simulation has indicated that the vias can be used to provide high isolation up to 40 decibels (dB) at 20 GHz when spaced at a minimum pitch of 400 microns (µm). The via fence and the gold-plated silicon enclosure walls allow individual elements of two separated circuits to be effectively put into their own electromagnetically shielded cavities to minimize cross coupling. The through-wafer vias promote substantially continuous ground continuity for the RF return currents between the top and bottom covers and enables probe testing of the filter after fabrication.

A further advantage of embodiments of the invention is that the "wall" formed by the gold-plated silicon enclosure walls and the via fence not only can be used to isolate channels, but also can be used to isolate individual elements. According to embodiments of the invention, electrical isolation between individual elements eliminates undesired cross-coupling seen in the prior art open-face printed designs and hence allows for rapid development and compact layout.

Yet further advantages of embodiments of the invention are that they are stable over temperature, offer superb manufacturing repeatability, are reliable under mechanical stress, offer low cost in mass production, and are totally sealed for foreign object debris (FOD) prevention.

Another advantage of embodiments of the invention is that they offer "deep" compaction by a factor of two when compared to single-sided prior art, effectively reducing a circuit area in half.

An additional advantage of embodiments of the invention is that passive components can now be printed directly on the substrates as compared to prior art techniques that use an additional substrate. A yet further advantage of embodiments of the invention is elimination of a need for a sub-cover as needed with prior art planar filters, thereby promoting compaction in a direction perpendicular to the center web, that is, in the "Z" direction.

A still additional advantage of embodiments of the invention is reducing compaction in a housing floor area, that is, in the "X-Y" plane. Embodiments of the invention eliminate one or more of a need to reserve headroom for installation of component substrates and a need to reserve headroom for re-working of the component substrates. Furthermore, embodiments of the invention enable easy creation of compact channelization. Embodiments of the invention provide a device that is 100 times more compact than the prior art device with a center web comprising many discrete components including one or more of a glass bead, a vertical pin, ribbon bonds, a center web, a plug, and different layers. By sharp contrast, embodiments of the invention employ a simple, single four-layer design comprising a top cover, a top substrate, a bottom substrate, and a bottom cover, thereby achieving comparable topology via a novel and completely different methodology.

A further advantage of embodiments of the invention is that one or more of a size of the device and a weight of the device is reduced by use of a semiconductor in one or more of the top cover and the bottom cover.

A still additional advantage of embodiments of the invention is that the one or more of micro-machining and plating of the one or more of the top cover and the bottom cover allows one or more of accurate cavity compaction, RF isolation, and easy mass production. For example, walls having a thickness of approximately 130 microns are possible in design of the microstrip.

Another advantage of embodiments of the invention is that the thermocompression bonding used to create the gold-gold homogenous bond makes possible one or more of an extremely strong bond and a high accuracy alignment. A further advantage of embodiments of the invention is that the high accuracy alignment enables one or more of automated H-frame construction and environmental protection without a need for manual assembly.

A still other advantage of embodiments of the invention is that one or more of the bumps machined into the covers and the bumps created on the substrates generate strong gold-gold thermocompression.

Using a hard substrate and high precision microelectronics plating for the signal path: allows higher precision plating techniques, consistent and mass production vias for interconnections. Additionally, using a substrate that is transparent may selectively be employed. This may provide for increased alignment between layers during bonding for consistent alignment of vias for reliable signal transmission. Moreover, using thru wafer vias may also be selectively employed, allowing for mass production of highly consistent interconnects for both signals and ground between layers of the H-frame thereby reducing manual assembly needs.

Embodiments of the invention provide an ability to create walls of arbitrary contours with high precision and repeatability.

Another advantage provided by embodiments of the invention is that additional compaction is provided by replacement of a metal center web in a conventional H-frame with a conceptual 3-layer printed circuit board (PCB). Higher compaction is provided by embodiments of the invention due to one or more of condensed routing and higher component counts.

A still further advantage of embodiments of the invention is elimination of prior art feed-through transitions that require many intricate parts and complex assembly procedures while incurring risks of one or more of large manufacturing variation and field leakage. By sharp contrast, embodiments of the invention enable manufacture of both chips in a single manufacturing step.

Still further advantages of embodiments of the invention include that they enable design of RF transitions with intricate features at no additional cost for optimal performance on return loss and insertion loss, and in particular, nearly perfect isolation is provided to other regions under the same cover.

Yet further advantages of embodiments of the invention include low insertion loss and high return loss. As shown by the graph 250 in FIG. 2D, the insertion loss 254 is less than approximately 0.2 dB over the entire frequency band 258. As also shown by the graph 250 in FIG. 2D, the return loss 256 exceeds approximately 20 dB over the entire frequency band 258.

A further advantage provided by embodiments of the invention is that transitions at multiple locations can be formed at the same time in the substrate.

There are a few distinct advantages of the disclosed microelectronics H-frame device. The device offers hard substrates, which have much better-defined shapes than the prior art softer printed circuit board layers and the prior art low-temperature, co-fired ceramic (LTCC) layers, which are prone to shrinkage. Better-defined geometry implies better-controlled RF characteristics such as line impedance and loss, and hence more predictable RF performance.

A still further advantage of embodiments of the invention is that a size of the feed-through transition including the end walls and cut-out in the ground plane is about 30 mil for a stack of two 8-mil thick substrates, compared to a typical dimension of approximately 102 mil for a prior art traditional machined H-frame housing. A further advantage of embodiments of the invention is providing more than tenfold savings in transition area. Yet another advantage provided by embodiments of the invention is providing the feed-through transitions without a requirement of creating additional parts or adding additional manufacturing steps needed to make them. A major differentiator between embodiments of the invention and traditional prior art machined H-frame devices is that embodiments of the invention provide compact, no-cost vertical feed-through.

An additional advantage of embodiments of the invention is providing three-dimensional field channelization and isolation. Embodiments of the invention allow circuit elements to be placed in close proximity but with a wall in-between that eliminates any potential coupling, and hence results in a more compact layout. Therefore another advantage of embodiments of the invention is circuit layout compaction.

The Microelectronics H-frame device provides an environmentally and electromagnetically sealed circuit package offering one or more of accuracy, precision, and high repeatability.

A further advantage of embodiments of the invention is that etched vias provide one or more of a smaller via diameter and a smaller via pitch. Moreover, according to embodiments of the invention, all vias in a given substrate, sometimes numbering in the tens of thousands, are fabricated simultaneously, promoting one or more of uniformity, consistency, and quality.

Embodiments of the invention offer high precision in patterning the metallization. A representative line width error for embodiments of the invention is approximately 1 micron, in comparison to prior art technologies that have typical line width errors that is typically at least ten times higher.

Embodiments of the invention comprise a stand-alone package. Embodiments of the invention comprise a higher-level assembly on which other components can be made directly or to which other components can be bonded.

The disclosed new method for constructing electronics modules and the new electronic device facilitate a reduction of an order of magnitude in size, weight, and power (SWAP). The disclosed new method and new device also provides built-in RF integrity for high quality RF products.

Described is a drastically different electronics device system with deep compaction, microelectronics precision, and unprecedented RF routing flexibility and manufacturing repeatability.

Another advantage of embodiments of the invention is the versatility of transmission line styles that is available. The disclosed microelectronics H-frame device allows RF transmission lines to be built using one or more of a microstrip, a coplanar waveguide (CPW), and a stripline. This flexibility allows a designer to choose appropriate line types at different areas for optimal RF performance.

Etched vias, unlike the punched or drilled vias in other technologies, provide an additional advantage. With etching, both via diameter and via pitch are smaller, and all vias in a substrate, sometimes in the tens of thousands, are made simultaneously, resulting in more uniform or consistent quality.

A still further advantage of embodiments of the invention is that combining two wafers in a stack essentially collapses the center web with a typical thinness in the range of 40 to 160 mils in a traditional machined H-frame into a thin metal layer that could be of merely a few microns thick. The change from a finite thickness to a "zero" thickness center web eliminates the need for a traditional feed-through. More importantly, collapse of the center web changes the design paradigm to using planar technology where intricate features realized in patterned metallization for optimal RF performance are now possible at no additional cost.

A further advantage of embodiments of the invention is easier assembly relative to the prior art. According to embodiments of the invention, combining two covers and two wafers in a stack completes the microelectronics H-frame assembly. This offers a tremendous cost saving in comparison to traditional machined H-frame where a metal housing has to be machined and plated first, and then populated with multiple substrates and components, and then sub-covers must be installed, and so on.

Another advantage provided by embodiments of the invention is versatile vertical walls. The covers not only totally sealed the package for foreign object debris (FOD) prevention, but also provides vertical walls wherever needed. For instance, the vertical wall provides channelization of RF paths, de-moding a cavity for stability, and good isolation in a vertical transition design.

A vertical feed-through in the microelectronics H-frame (FIG. 2E) comprises one or more of patterned metallization on the substrates, through-substrate vias, and vertical metal walls offered by the micro-machined covers. The transition is designed with intricate features at no additional cost for optimal performance on return loss and insertion loss, and in particular the nearly perfect isolation to other regions under the same cover.

A further advantage of embodiments of the invention is that a distance between the escape line and the spiral turns is increased from approximately 3 microns for a representative prior art air bridge to a wafer thickness of approximately 200 microns. The increased spacing reduces the capacitive coupling, thereby helping to reduce performance sensitivity to manufacturing variation.

While the above representative embodiments have been described with certain components in exemplary configurations, it will be understood by one of ordinary skill in the art that other representative embodiments can be implemented using different configurations and/or different components. For example, it will be understood by one of ordinary skill in the art that the order of certain steps and certain components can be altered without substantially impairing the functioning of the invention. It will be further understood by those of skill in the art that the number of variations of embodiments of the invention are virtually limitless. For example, a stack comprising more than two wafers could be used. For example, if three wafers are used, there will be four metal layers, four different vertical RF transitions, and two metal layers for escaping from the 5-sided sealed covers and input and output. For example, the respective designations of "top" and "bottom" are arbitrary. Such designations can be reversed or otherwise changed without substantially altering the invention. For example, instead of being plated onto a substrate, bonding bumps can be plated onto one or more of a top cover and a bottom cover.

For example, the number of top substrate signal vias is arbitrary and is not limited to the specific examples provided. For example, the number of top substrate ground vias is arbitrary and is not limited to the specific examples provided. For example, the number of bottom substrate signal vias is arbitrary and is not limited to the specific examples provided. For example, the number of bottom substrate ground vias is arbitrary and is not limited to the specific examples provided.

The representative embodiments and disclosed subject matter, which have been described in detail herein, have been presented by way of example and illustration and not by way of limitation. It will be understood by those skilled in the art that various changes may be made in the form and details of the described embodiments resulting in equivalent embodiments that remain within the scope of the invention. It is intended, therefore, that the subject matter in the above description shall be interpreted as illustrative and shall not be interpreted in a limiting sense.

What is claimed is:

1. A microelectronics H-frame device, comprising:
a substrate stack comprising at least a top substrate and a bottom substrate, wherein bonding of the top substrate to the bottom substrate creates a vertical electrical connection between the top substrate and the bottom substrate, wherein a top surface of the top substrate comprises top substrate top metallization, wherein a bottom surface of the bottom substrate comprises bottom substrate bottom metallization, wherein the top surface of the top substrate and the bottom surface of the bottom substrate are fabricated together on a front of a wafer;
mid-substrate metallization located between the top substrate and the bottom substrate;
a micro-machined top cover bonded to a top side of the substrate stack; and
a micro-machined bottom cover bonded to a bottom side of the substrate stack, wherein the bottom surface of the top substrate comprises top substrate bottom metallization, and wherein the top substrate further comprises metallized top substrate through-substrate vias connecting the top substrate top metallization and the top substrate bottom metallization, the metallized top substrate through-substrate vias forming a first vertical electrical connection between the top substrate top metallization and the top substrate bottom metallization.

2. The device of claim 1, wherein the top surface of the bottom substrate comprises bottom substrate top metallization, and wherein the bottom substrate further comprises metallized bottom substrate through-substrate vias connecting the bottom substrate top metallization and the bottom substrate bottom metallization, the metallized bottom substrate through-substrate vias forming a second vertical electrical connection between the bottom substrate top metallization and the bottom substrate bottom metallization.

3. The device of claim 2, wherein bonding of the top substrate to the bottom substrate creates a third vertical electrical connection between the top substrate bottom metallization and the bottom substrate top metallization.

4. The device of claim 3, wherein, using the first vertical electrical connection, the top substrate top metallization is electrically connected to the top substrate bottom metallization at an outer side of the top cover, and wherein a shape in the top substrate bottom metallization connects the first vertical electrical connection at an outer side of the top cover to a second vertical electrical connection at an inner side of the top cover, and wherein using the second vertical electrical connection, the top substrate bottom metallization is electrically connected to the top substrate top metallization on an inner side of the top cover.

5. The device of claim 3, wherein, using the second vertical electrical connection, the bottom substrate bottom metallization is electrically connected to the bottom substrate top metallization at an inner side of the bottom cover, wherein a shape in the bottom substrate top metallization connects the second vertical electrical connection at an inner side of the bottom cover to the third vertical electrical connection at an outer side of the top cover, wherein, using the third vertical connection, the bottom substrate top metallization is electrically connected to the top substrate bottom metallization at an outer side of the top cover, and wherein, using the first vertical electrical connection, the top substrate bottom metallization is electrically connected to the top substrate top metallization at the outer side of the top cover.

6. The device of claim 3, wherein, using the first vertical connection, the top substrate top metallization is electrically connected to the top substrate bottom metallization, wherein, using the third vertical connection, the top substrate bottom metallization is electrically connected to the bottom substrate top metallization, and wherein, using the second vertical connection, the bottom substrate top metallization is electrically connected to the bottom substrate bottom metallization.

7. The device of claim 3, wherein the bonding of the top substrate to the bottom substrate forms one or more signal metallizations, each of which comprises an interconnection of two or more of:
   a. a signal top substrate top metallization,
   b. a signal through-substrate via comprised in the top substrate,
   c. a signal top substrate bottom metallization,
   d. a signal bottom substrate top metallization,
   e. a signal through-substrate vias comprised in the bottom substrate, and
   f. a signal bottom substrate bottom metallization.

8. The device of claim 1, wherein the top cover comprises top cover metalization.

9. The device of claim 1, wherein the bottom cover comprises bottom cover metallization.

10. The device of claim 3, wherein bonding of the top cover to the top substrate creates the first vertical electrical connection between the top substrate top metallization and the top cover metallization, and wherein bonding of the bottom cover to the bottom substrate creates the second vertical electrical connection between the bottom substrate top metallization and the bottom cover metallization.

11. The device of claim 10, where the bonding of the top cover, the top substrate, the bottom substrate and the bottom cover forms a reference metallization, which comprises one or more of:
   a. the top cover metallization,
   b. a reference top substrate top metallization,
   c. reference top substrate through-substrate vias comprised in the top substrate,
   d. a reference top substrate bottom metallization,
   e. a reference bottom substrate top metallization,
   f. reference bottom substrate through-substrate vias comprised in the bottom substrate,
   g. the reference bottom substrate bottom metallization, and
   h. the bottom cover metallization.

* * * * *